(12) United States Patent
Seo et al.

(10) Patent No.: US 12,075,642 B2
(45) Date of Patent: Aug. 27, 2024

(54) LIGHT-EMITTING DEVICE, DISPLAY DEVICE, AND ELECTRONIC DEVICE

(71) Applicant: Semiconductor Energy Laboratory Co., Ltd., Kanagawa-ken (JP)

(72) Inventors: Satoshi Seo, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 652 days.

(21) Appl. No.: 15/734,633

(22) PCT Filed: May 31, 2019

(86) PCT No.: PCT/IB2019/054510
§ 371 (c)(1),
(2) Date: Dec. 3, 2020

(87) PCT Pub. No.: WO2019/234562
PCT Pub. Date: Dec. 12, 2019

(65) Prior Publication Data
US 2021/0234112 A1 Jul. 29, 2021

(30) Foreign Application Priority Data

Jun. 6, 2018 (JP) .................... 2018-108414
Jun. 6, 2018 (JP) .................... 2018-108428
Jan. 21, 2019 (JP) .................... 2019-007585

(51) Int. Cl.
*H10K 50/115* (2023.01)
*H10K 50/854* (2023.01)
(Continued)

(52) U.S. Cl.
CPC ......... *H10K 50/115* (2023.02); *H10K 50/854* (2023.02); *H10K 59/121* (2023.02); *H10K 59/38* (2023.02)

(58) Field of Classification Search
CPC ............. H10K 50/115; H10K 50/854; H10K 59/121; H10K 59/38; H10K 50/19;
(Continued)

(56) References Cited

U.S. PATENT DOCUMENTS 6,121,726 A 9/2000 Codama et al.
6,639,250 B1 10/2003 Shimoda et al.
(Continued)

FOREIGN PATENT DOCUMENTS

CN 106465507 A 2/2017
CN 106653800 A 5/2017
(Continued)

OTHER PUBLICATIONS

International Search Report (Application No. PCT/IB2019/054510) dated Sep. 3, 2019.
(Continued)

*Primary Examiner* — Douglas W Owens
(74) *Attorney, Agent, or Firm* — Husch Blackwell LLP

(57) ABSTRACT

A novel light-emitting device is provided. A light-emitting device or a display device having high display quality is provided. An electronic device including a display portion with high display quality is provided. Provided is a light-emitting device including a first pixel which includes a first light-emitting element and a light-scattering layer; and a second pixel which includes a second light-emitting element and a first color conversion layer, in which an emission center substance in each of the first light-emitting element and the second light-emitting element is an organic compound, the light-scattering layer includes a first substance that scatters light emitted from the first light-emitting element, the first color conversion layer includes a second substance that emits light by absorbing light emitted from the second light-emitting element, and the first light-emit-
(Continued)

ting element and the second light-emitting element have a microcavity structure.

18 Claims, 16 Drawing Sheets

(51) Int. Cl.
 *H10K 59/121* (2023.01)
 *H10K 59/38* (2023.01)
(58) Field of Classification Search
 CPC ............... H10K 50/865; H10K 50/852; H10K 50/856; H10K 59/35; H10K 2102/331; G09F 9/30; H05B 33/12; H05B 33/24
 See application file for complete search history.

(56) References Cited

U.S. PATENT DOCUMENTS

| | | | |
|---|---|---|---|
| 6,739,931 B2 | 5/2004 | Yamazaki et al. | |
| 6,762,553 B1 | 7/2004 | Yokogawa et al. | |
| 6,995,511 B2 | 2/2006 | Yamazaki et al. | |
| 7,057,339 B2 | 6/2006 | Boroson et al. | |
| 7,399,991 B2 | 7/2008 | Seo et al. | |
| 7,459,849 B2 | 12/2008 | Yamazaki et al. | |
| 7,514,868 B2 | 4/2009 | Yamazaki et al. | |
| 7,531,856 B2 | 5/2009 | Kobori | |
| 7,564,182 B2 | 7/2009 | Boroson et al. | |
| 7,732,808 B2 | 6/2010 | Ikeda et al. | |
| 7,745,989 B2 | 6/2010 | Yamazaki et al. | |
| 7,919,783 B2 | 4/2011 | Ushikubo et al. | |
| 7,956,349 B2 | 6/2011 | Tsutsui et al. | |
| 8,044,588 B2 | 10/2011 | Yamazaki et al. | |
| 8,076,671 B2 | 12/2011 | Yamazaki et al. | |
| 8,178,217 B2 | 5/2012 | Nomura et al. | |
| 8,420,227 B2 | 4/2013 | Iwaki et al. | |
| 8,421,346 B2 | 4/2013 | Osaka et al. | |
| 8,421,352 B2 | 4/2013 | Yamazaki et al. | |
| 8,618,732 B2 | 12/2013 | Yamazaki et al. | |
| 8,642,190 B2 | 2/2014 | Ogita et al. | |
| 8,993,126 B2 | 3/2015 | Nowatari et al. | |
| 9,006,755 B2 | 4/2015 | Seo et al. | |
| 9,051,239 B2 | 6/2015 | Osaka et al. | |
| 9,099,409 B2 | 8/2015 | Fujita | |
| 9,142,710 B2 | 9/2015 | Seo et al. | |
| 9,178,158 B2 | 11/2015 | Kitano et al. | |
| 9,263,503 B2 | 2/2016 | Yamazaki et al. | |
| 9,269,920 B2 | 2/2016 | Yamazaki et al. | |
| 9,362,517 B2 | 6/2016 | Ohsawa et al. | |
| 9,368,742 B2 | 6/2016 | Kawata. et al. | |
| 9,385,328 B2 | 7/2016 | Ogita et al. | |
| 9,412,962 B2 | 8/2016 | Hamada et al. | |
| 9,419,239 B2 | 8/2016 | Seo et al. | |
| 9,496,503 B2 | 11/2016 | Takeda et al. | |
| 9,496,505 B2 | 11/2016 | Nowatari et al. | |
| 9,515,279 B2 | 12/2016 | Ishisone et al. | |
| 9,548,468 B2 | 1/2017 | Seo et al. | |
| 9,559,324 B2 | 1/2017 | Seo et al. | |
| 9,577,222 B2 | 2/2017 | Seo et al. | |
| 9,634,263 B2 | 4/2017 | Ogita et al. | |
| 9,634,279 B2 | 4/2017 | Seo et al. | |
| 9,653,517 B2 | 5/2017 | Uesaka et al. | |
| 9,653,705 B2 | 5/2017 | Uesaka et al. | |
| 9,741,937 B2 | 8/2017 | Osaka et al. | |
| 9,773,846 B2 | 9/2017 | Oh et al. | |
| 9,935,292 B2 | 4/2018 | Seo et al. | |
| 10,556,864 B2 | 2/2020 | Nomura et al. | |
| 10,777,762 B2 | 9/2020 | Seo et al. | |
| 10,790,462 B2 | 9/2020 | Seo et al. | |
| 11,018,323 B2 | 5/2021 | Lee et al. | |
| 11,545,642 B2 | 1/2023 | Seo et al. | |
| 2006/0240277 A1 | 10/2006 | Hatwar et al. | |
| 2007/0103056 A1 | 5/2007 | Cok | |
| 2007/0109571 A1 | 5/2007 | Kawamura | |
| 2007/0138947 A1 | 6/2007 | Popovic et al. | |
| 2007/0145350 A1 | 6/2007 | Kobori | |
| 2007/0200492 A1* | 8/2007 | Cok | H10K 59/38 313/506 |
| 2007/0205423 A1 | 9/2007 | Yamazaki et al. | |
| 2008/0129195 A1 | 6/2008 | Ishizaki et al. | |
| 2008/0272690 A1 | 11/2008 | Kuma et al. | |
| 2009/0051278 A1 | 2/2009 | Saneto et al. | |
| 2009/0091241 A1 | 4/2009 | Tsou et al. | |
| 2009/0160323 A1 | 6/2009 | Nomura et al. | |
| 2009/0167156 A1 | 7/2009 | Kawamura et al. | |
| 2010/0001637 A1 | 1/2010 | Satou | |
| 2010/0104969 A1 | 4/2010 | Mochizuki et al. | |
| 2010/0171417 A1* | 7/2010 | Kitamura | C09K 11/06 313/504 |
| 2010/0292399 A1 | 11/2010 | Brown et al. | |
| 2010/0301744 A1 | 12/2010 | Osaka et al. | |
| 2012/0080667 A1 | 4/2012 | Nowatari et al. | |
| 2012/0187394 A1 | 7/2012 | Hatano et al. | |
| 2012/0205632 A1 | 8/2012 | Shitagaki et al. | |
| 2012/0228648 A1 | 9/2012 | Mitsuya | |
| 2012/0235197 A1 | 9/2012 | Okuyama | |
| 2013/0146903 A1 | 6/2013 | Ichikawa et al. | |
| 2013/0214249 A1 | 8/2013 | Pan et al. | |
| 2014/0014960 A1 | 1/2014 | Yamazaki et al. | |
| 2014/0034932 A1 | 2/2014 | Seo et al. | |
| 2014/0084274 A1 | 3/2014 | Yamazaki et al. | |
| 2014/0312339 A1 | 10/2014 | Fujita | |
| 2014/0319492 A1 | 10/2014 | Seo et al. | |
| 2015/0214281 A1 | 7/2015 | Hack et al. | |
| 2015/0333283 A1 | 11/2015 | Ishisone et al. | |
| 2015/0349285 A1 | 12/2015 | Seo et al. | |
| 2016/0028022 A1 | 1/2016 | Seo et al. | |
| 2016/0093678 A1 | 3/2016 | Seo et al. | |
| 2016/0093823 A1 | 3/2016 | Seo et al. | |
| 2016/0225273 A1 | 8/2016 | Baruah et al. | |
| 2016/0248031 A1 | 8/2016 | Seo | |
| 2016/0268536 A1 | 9/2016 | Ohsawa et al. | |
| 2016/0301011 A1 | 10/2016 | Nakaie et al. | |
| 2016/0308156 A1 | 10/2016 | Kawata et al. | |
| 2016/0343942 A1 | 11/2016 | Hamada et al. | |
| 2016/0343949 A1 | 11/2016 | Seo et al. | |
| 2016/0343954 A1 | 11/2016 | Seo et al. | |
| 2016/0351850 A1 | 12/2016 | Lin et al. | |
| 2016/0372688 A1 | 12/2016 | Seo et al. | |
| 2017/0025615 A1 | 1/2017 | Seo et al. | |
| 2017/0025630 A1 | 1/2017 | Seo et al. | |
| 2017/0053970 A1 | 2/2017 | Ishisone et al. | |
| 2017/0054088 A1 | 2/2017 | Nowatari et al. | |
| 2017/0062749 A1 | 3/2017 | Seo et al. | |
| 2017/0092889 A1 | 3/2017 | Seo et al. | |
| 2017/0117497 A1 | 4/2017 | Seo et al. | |
| 2017/0125740 A1 | 5/2017 | Lee et al. | |
| 2017/0141339 A1 | 5/2017 | Seo et al. | |
| 2017/0194387 A1 | 7/2017 | Oh et al. | |
| 2017/0213991 A1 | 7/2017 | Uesaka et al. | |
| 2017/0365782 A1 | 12/2017 | Osaka et al. | |
| 2018/0009751 A1 | 1/2018 | Nomura et al. | |
| 2019/0027689 A1 | 1/2019 | Funyuu et al. | |
| 2020/0176692 A1 | 6/2020 | Watabe et al. | |
| 2021/0288291 A1 | 9/2021 | Lee et al. | |

FOREIGN PATENT DOCUMENTS

| | | |
|---|---|---|
| CN | 106935714 A | 7/2017 |
| EP | 3 188 272 A1 | 7/2017 |
| JP | 2009-070814 A | 4/2009 |
| JP | 2010-015785 A | 1/2010 |
| JP | 2012-174334 A | 9/2012 |
| JP | 2015-026418 A | 2/2015 |
| JP | 2016-006768 A | 1/2016 |
| JP | 2016-225273 A | 12/2016 |
| JP | 2017-037121 A | 2/2017 |
| JP | 2017-062902 A | 3/2017 |
| KR | 2009-0019753 A | 2/2009 |
| KR | 2017-0010861 A | 2/2017 |
| KR | 2017-0051764 A | 5/2017 |
| KR | 2017-0077929 A | 7/2017 |
| KR | 2017-0080923 A | 7/2017 |
| TW | 201608714 | 3/2016 |

(56) References Cited

FOREIGN PATENT DOCUMENTS

| | | |
|---|---|---|
| TW | 201642458 | 12/2016 |
| WO | WO 2011/145358 A1 | 11/2011 |
| WO | WO 2013/073611 A1 | 5/2013 |
| WO | WO 2015/181678 A1 | 12/2015 |
| WO | WO 2016/098570 A1 | 6/2016 |

OTHER PUBLICATIONS

Written Opinion (Application No. PCT/IB2019/054510) dated Sep. 3, 2019.

* cited by examiner

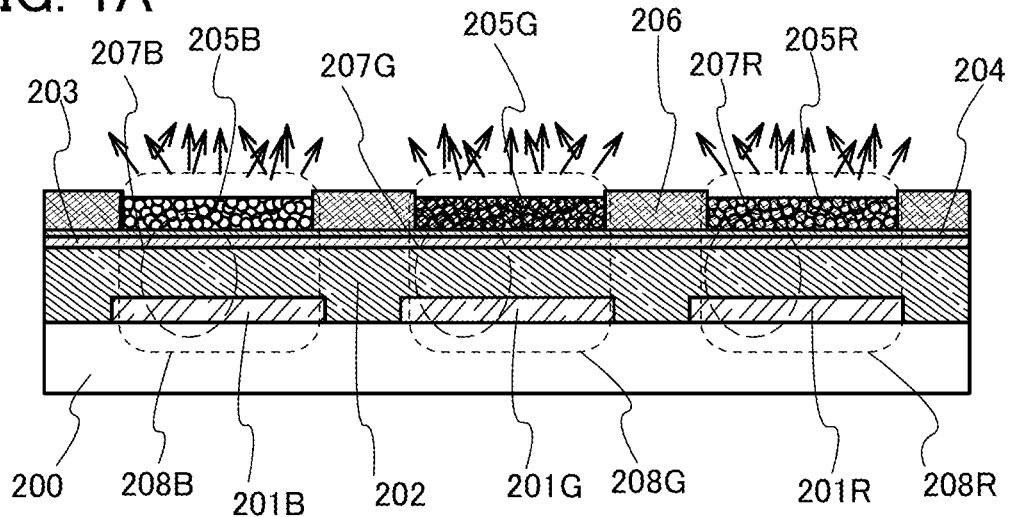
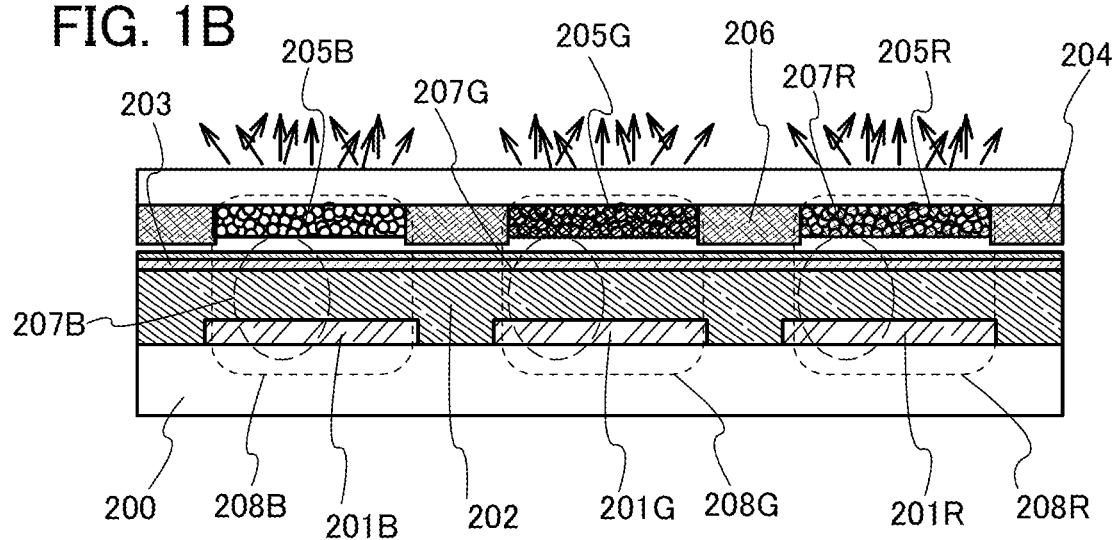
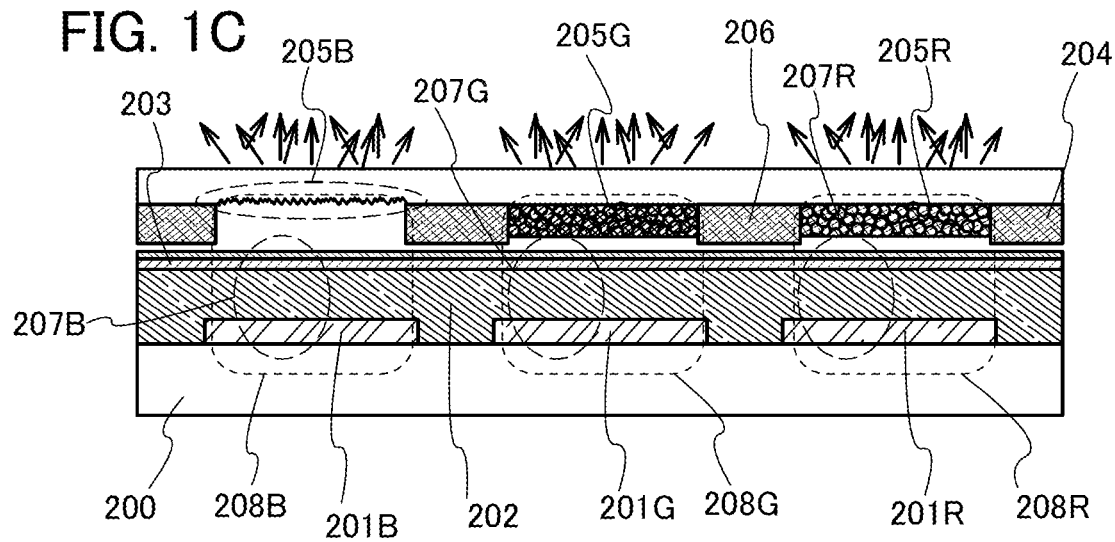

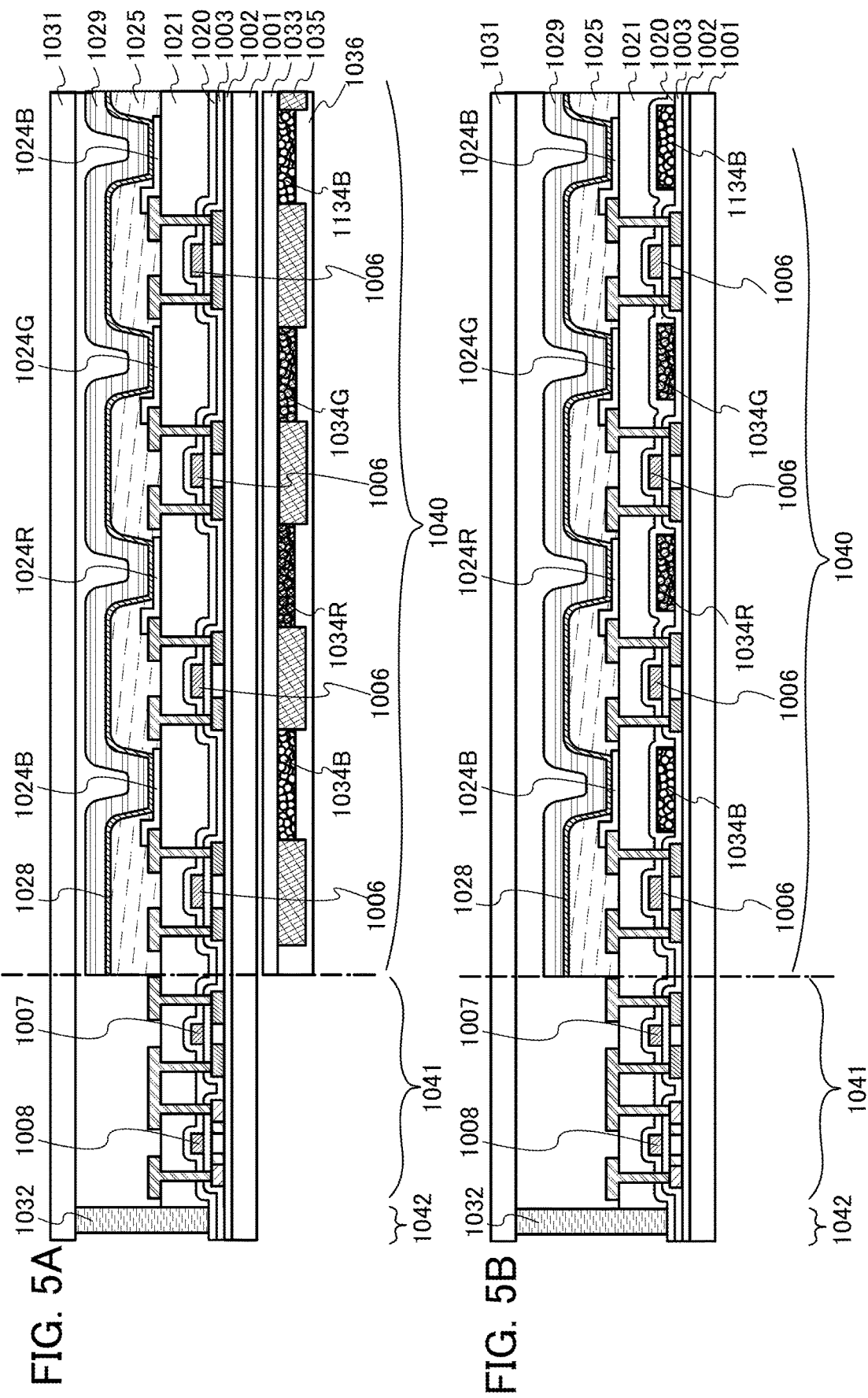

FIG. 7A
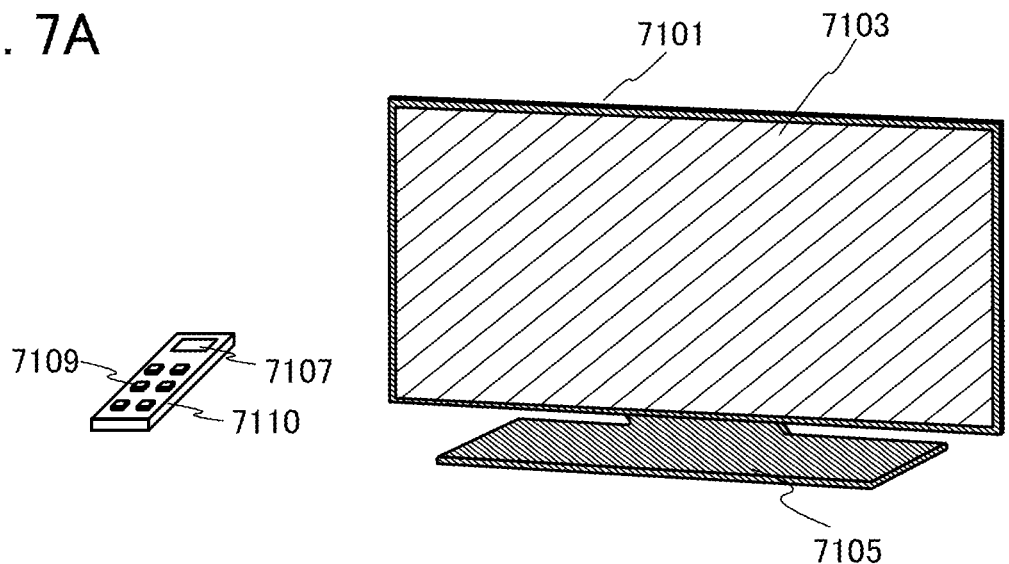
FIG. 7B1
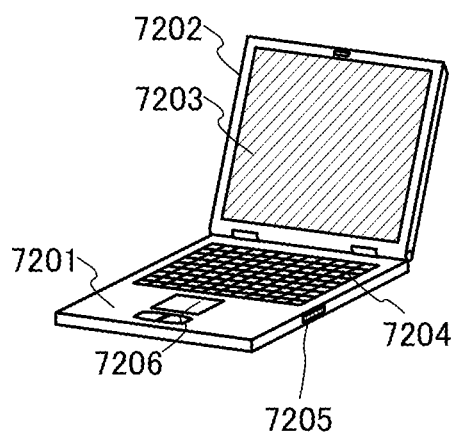
FIG. 7B2
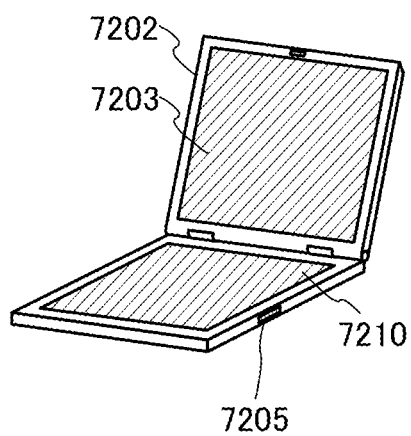
FIG. 7C
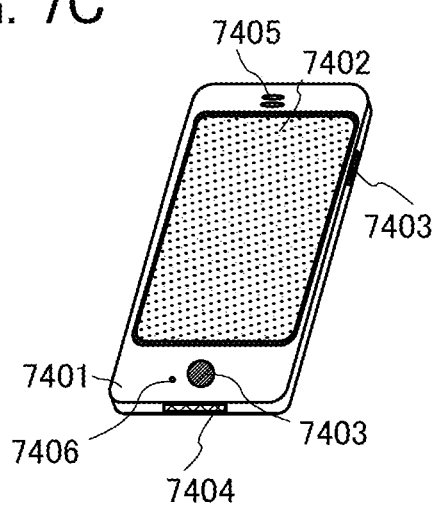

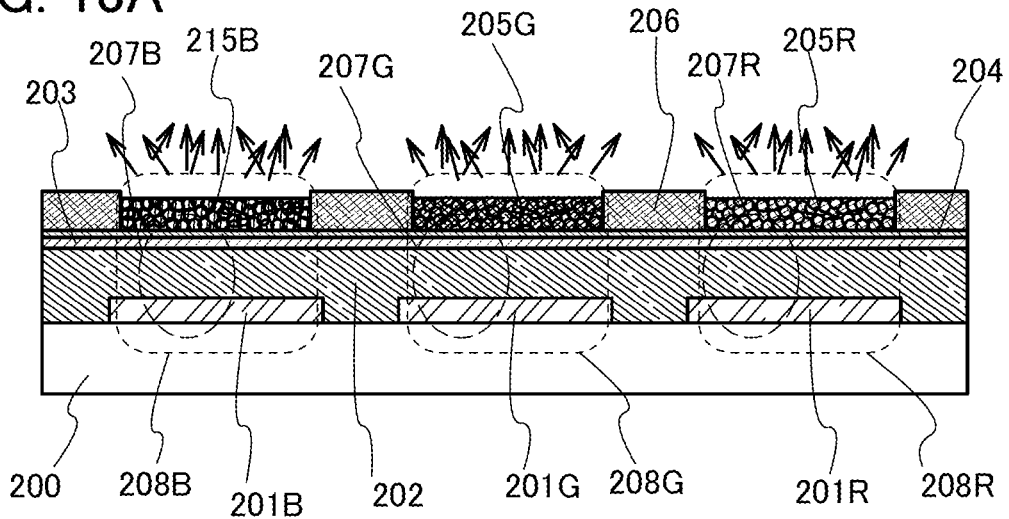
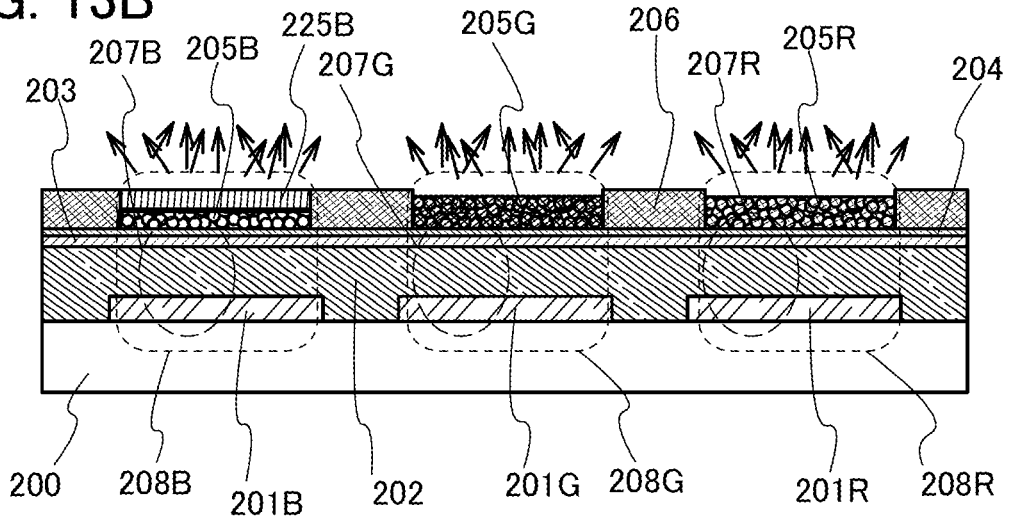
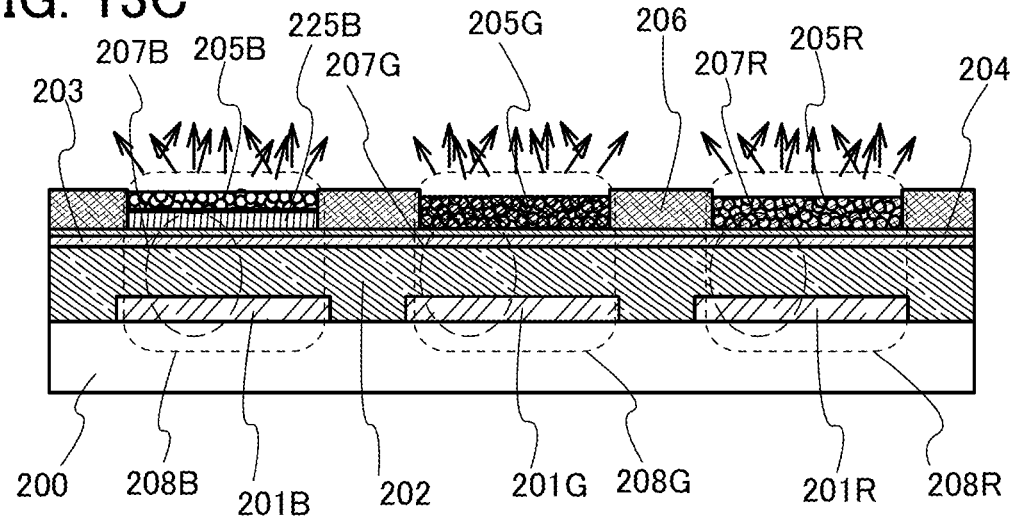

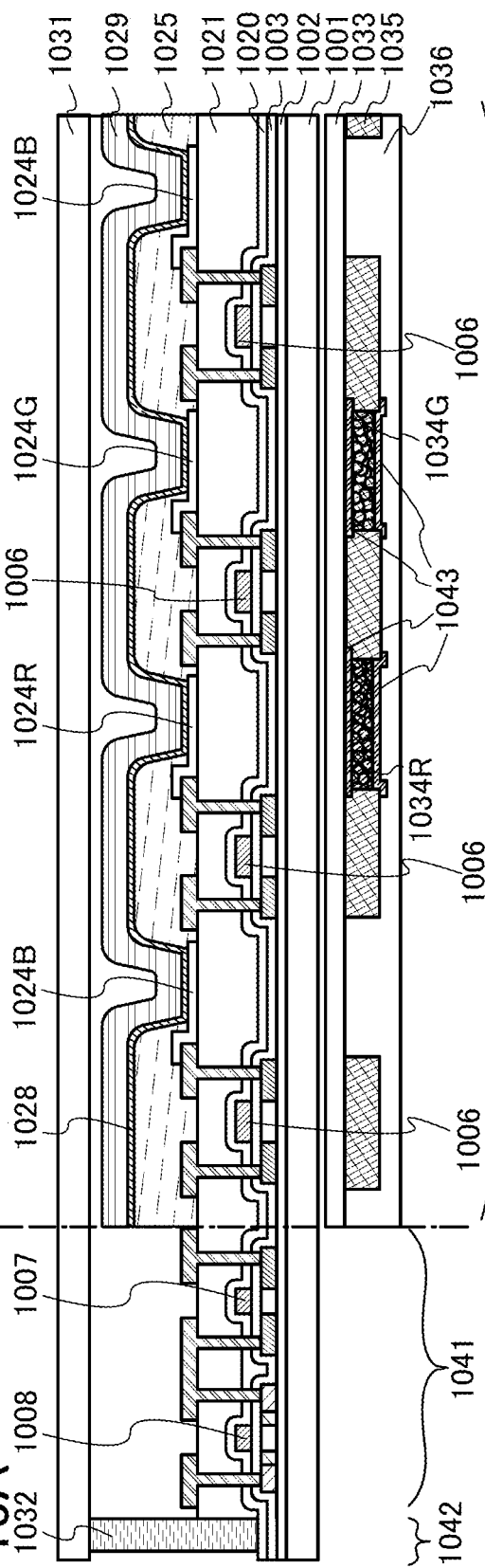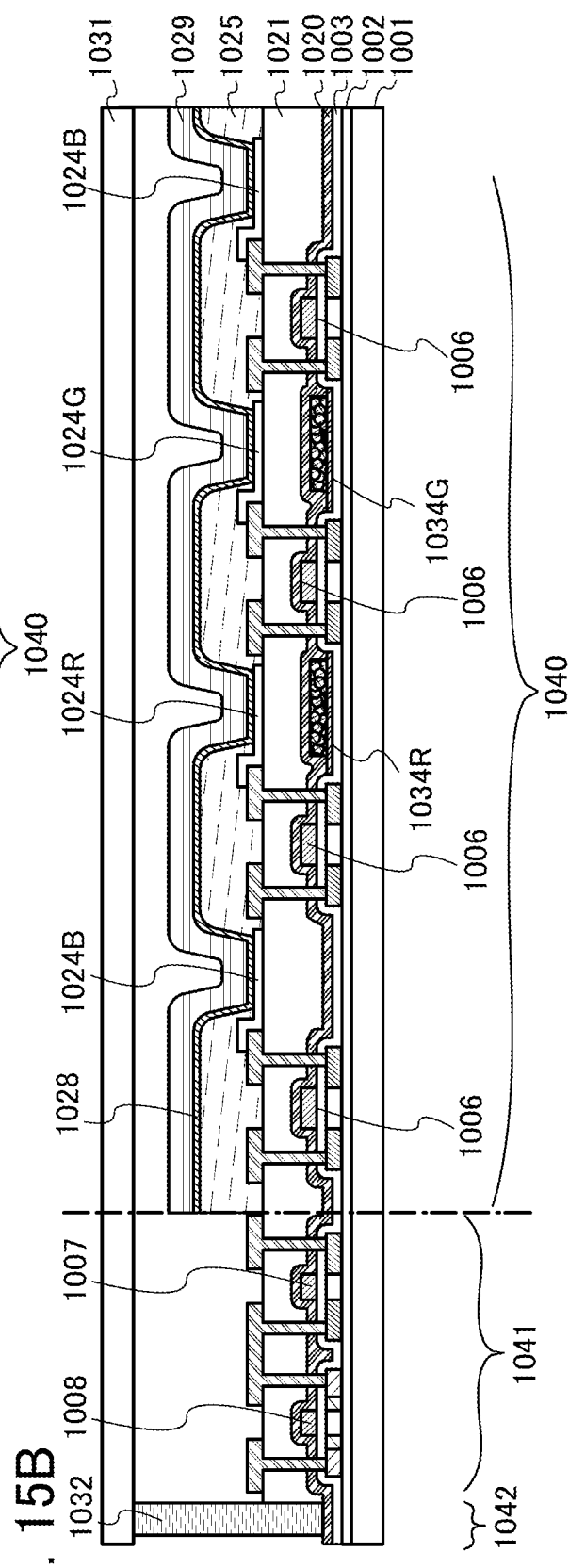

LIGHT-EMITTING DEVICE, DISPLAY DEVICE, AND ELECTRONIC DEVICE

This application is a 371 of international application PCT/IB2019/054510 filed on May 31, 2019 which is incorporated herein by reference.

TECHNICAL FIELD

One embodiment of the present invention relates to a light-emitting element, a display module, a lighting module, a display device, a light-emitting device, an electronic device, and a lighting device. Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

BACKGROUND ART

Light-emitting elements (organic EL elements) that use organic compounds and utilize electroluminescence (EL) have been put into practical use. The basic structure of such light-emitting elements is that a layer (EL layer) containing a light-emitting material made of an organic compound is interposed between a pair of electrodes. Carriers are injected by application of voltage to this device, and recombination energy of the carriers is used, whereby light emission can be obtained from the light-emitting material.

Such light-emitting elements are of self-light-emitting type, and have advantages over liquid crystal elements such as high visibility and no need for backlight when used for pixels of a display; accordingly, the light-emitting elements are suitable as flat panel display elements. Displays using such light-emitting elements are also highly advantageous in that they can be fabricated thin and lightweight. Moreover, an extremely fast response speed is also a feature.

In the case where the light-emitting elements are used for pixels of a full-color display, at least light of three colors, red, green, and blue, needs to be obtained; there are mainly two kinds of methods as a typical method for obtaining light of the three colors. One is a method using light-emitting elements exhibiting light of the respective colors, and the other is a method using all light-emitting elements exhibiting light of the same color and changing the emitted light to desired light for the respective pixels.

The former is advantageous in emission efficiency because of small light loss, while the latter is advantageous in cost because there is no necessity to form light-emitting elements separately for pixels, which facilitates the manufacture and increases the yield.

In the method of changing the emitted light to desired light for the respective pixels, typical methods of changing the light emitted from the light-emitting elements to desired light are a method of obtaining desired light by blocking part of light from a light-emitting element and a method of obtaining desired light by converting the light; the latter method causes smaller energy loss, although depends on conversion efficiency, than the former method by which part of obtained light is simply blocked. Accordingly, the latter method enables light-emitting devices with low power consumption to be easily obtained.

In the above-described method of obtaining desired light by converting light, a color conversion layer utilizing photoluminescence is used. The color conversion layer includes substances that are excited to emit light by absorbing light. Although there is conventionally a color conversion layer utilizing an organic compound, a color conversion layer utilizing quantum dots (QDs) has been put into practical use in recent years.

REFERENCE

Patent Document

[Patent Document 1] PCT International Publication No. WO2016/098570

SUMMARY OF THE INVENTION

Problems to be Solved by the Invention

Thus, an object of one embodiment of the present invention is to provide a novel light-emitting device. Another object is to provide a light-emitting device or a display device having high display quality. Another object is to provide an electronic device including a display portion having high display quality.

It is only necessary that at least one of the above-described objects be achieved in the present invention.

Means for Solving the Problems

One embodiment of the present invention is a light-emitting device including a first pixel which includes a first light-emitting element and a light-scattering layer; and a second pixel which includes a second light-emitting element and a first color conversion layer, in which an emission center substance in each of the first light-emitting element and the second light-emitting element is an organic compound, the light-scattering layer includes a first substance that scatters light emitted from the first light-emitting element, the first color conversion layer includes a second substance that emits light by absorbing light emitted from the second light-emitting element, and the first light-emitting element and the second light-emitting element have a microcavity structure.

Another embodiment of the present invention is the light-emitting device with the above structure, in which the microcavity structure is configured to enhance blue light Another embodiment of the present invention is a light-emitting device including a first pixel which includes a first light-emitting element and a light-scattering layer; and a second pixel which includes a second light-emitting element and a first color conversion layer, in which the first light-emitting element includes a first anode, a first cathode, and a first EL layer positioned between the first anode and the first cathode, the second light-emitting element includes a second anode, a second cathode, and a second EL layer positioned between the second anode and the second cathode, one of the first anode and the first cathode is a reflective electrode and the other is a semi-transmissive and semi-reflective electrode, one of the second anode and the second cathode is a reflective electrode and the other is a semi-transmissive and semi-reflective electrode, each of the first EL layer and the second EL layer includes an emission center substance, the emission center substance is an organic substance, the light-scattering layer includes a first substance that scatters light emitted from the first light-emitting element, and the first color conversion layer includes a second substance that emits light by absorbing light emitted from the second light-emitting element.

Another embodiment of the present invention is the light-emitting device with the above structure, further including a third pixel, in which the third pixel includes a third light-emitting element and a second color conversion layer, the third light-emitting element includes a third anode, a third cathode, and a third EL layer positioned between the third anode and the third cathode, one of the third anode and the third cathode is a reflective electrode and the other is a semi-transmissive and semi-reflective electrode, the third EL layer includes an emission center substance, the emission center substance is an organic compound, and the second color conversion layer includes a third substance that emits light by absorbing light emitted from the third light-emitting element.

Another embodiment of the present invention is the light-emitting device with the above structure, in which an optical distance between an interface of the reflective electrode on the semi-transmissive and semi-reflective electrode side and an interface of the semi-transmissive and semi-reflective electrode on the reflective electrode side is the integral multiple of $\lambda/4$ (note that $\lambda$ is 420 nm to 480 nm).

Another embodiment of the present invention is the light-emitting device with the above structure, in which the peak wavelength of light emitted from the emission center substance is 420 nm to 480 nm.

Another embodiment of the present invention is the light-emitting device with the above structure, in which the emission center substance is a common substance in the first light-emitting element and the second light-emitting element.

Another embodiment of the present invention is the light-emitting device with the above structure, in which the first substance is a microparticle of titanium oxide Another embodiment of the present invention is the light-emitting device with the above structure, in which the second substance is a quantum dot.

Another embodiment of the present invention is the light-emitting device with the above structure, in which the first pixel and the second pixel exhibit light with different wavelengths.

Another embodiment of the present invention is the light-emitting device with the above structure, further including a third pixel, in which the third pixel includes a third light-emitting element and a second color conversion layer, the second color conversion layer includes a third substance that emits light by absorbing light emitted from the third light-emitting element, and the third light-emitting element has a microcavity structure.

Another embodiment of the present invention is the light-emitting device with the above structure, in which the third substance is a quantum dot.

Another embodiment of the present invention is the light-emitting device with the above structure, in which the emission center substance is a common substance in the first light-emitting element, the second light-emitting element, and the third light-emitting element.

Another embodiment of the present invention is the light-emitting device with the above structure, in which the first pixel, the second pixel, and the third pixel exhibit light with different wavelengths.

Another embodiment of the present invention is a light-emitting device including a first pixel which includes a first light-emitting element; a second pixel which includes a second light-emitting element, a first color conversion layer, and a means for imparting directivity to light emitted from the first color conversion layer, in which an emission center substance in each of the first light-emitting element and the second light-emitting element is an organic compound, the first color conversion layer includes a substance that emits light by absorbing light emitted from the second light-emitting element, and the first light-emitting element and the second light-emitting element have a microcavity structure.

Another embodiment of the present invention is a light-emitting device including a first pixel which includes a first light-emitting element; and a second pixel which includes a second light-emitting element and a first color conversion layer, in which an emission center substance in each of the first light-emitting element and the second light-emitting element is an organic compound, the first color conversion layer includes a substance that emits light by absorbing light emitted from the second light-emitting element, the first color conversion layer is interposed between semi-transmissive and semi-reflective layers having a reflectivity higher than or equal to 20% and lower than or equal to 80% with respect to light emitted from the first color conversion layer, and the first light-emitting element and the second light-emitting element have a microcavity structure.

Another embodiment of the present invention is the light-emitting device with the above structure, in which the optical distance of a portion interposed between the semi-transmissive and semi-reflective layers is the integral multiple of $\lambda/4$ when the peak wavelength of light emitted from the first color conversion layer is $\lambda$.

Another embodiment of the present invention is the light-emitting device with the above structure, in which the microcavity structure is configured to enhance blue light.

Another embodiment of the present invention is the light-emitting device with the above structure, in which the peak wavelength of light emitted from the emission center substance is 420 nm to 480 nm.

Another embodiment of the present invention is the light-emitting device with the above structure, in which the emission center substance is a common substance in the first light-emitting element and the second light-emitting element.

Another embodiment of the present invention is the light-emitting device with the above structure, in which the first light-emitting element and the second light-emitting element have the same structure.

Another embodiment of the present invention is the light-emitting device with the above structure, in which the second substance is a quantum dot.

Another embodiment of the present invention is the light-emitting device with the above structure, in which the first pixel and the second pixel exhibit light with different wavelengths.

Another embodiment of the present invention is the light-emitting device with the above structure, further including a third pixel, in which the third pixel includes a third light-emitting element and a second color conversion layer, and a means for imparting directivity to light emitted from the second color conversion layer, the second color conversion layer includes a third substance that emits light by absorbing light emitted from the third light-emitting element, and the third light-emitting element has a microcavity structure.

Another embodiment of the present invention is the light-emitting device with the above structure, further including a third pixel, in which the third pixel includes a third light-emitting element and a second color conversion layer, the second color conversion layer includes a third substance that emits light by absorbing light emitted from the third light-emitting element, the second color conversion layer is interposed between semi-transmissive and semi-reflective layers having a reflectivity higher than or equal to 20% and lower than or equal to 80% with respect to light emitted from the second color conversion layer, and the third light-emitting element has a microcavity structure.

Another embodiment of the present invention is the light-emitting device with the above structure, in which the optical distance of a portion interposed between the semi-transmissive and semi-reflective layers is the integral multiple of $\lambda/2$ when the peak wavelength of the light emitted from the second color conversion layer is $\lambda$.

Another embodiment of the present invention is the light-emitting device with the above structure, in which the third substance is a quantum dot.

Another embodiment of the present invention is the light-emitting device with the above structure, in which the emission center substance is a common substance in the first light-emitting element, the second light-emitting element, and the third light-emitting element.

Another embodiment of the present invention is the light-emitting device with the above structure, in which the first pixel, the second pixel, and the third pixel exhibit light with different wavelengths.

Another embodiment of the present invention is an electronic device including the above light-emitting device, and a sensor, an operation button, a speaker, or a microphone.

Another embodiment of the present invention is the light-emitting device with the above structure, including a transistor or a substrate.

Another embodiment of the present invention is a lighting device including the light-emitting device and a housing.

Another embodiment of the present invention is a display device including the light-emitting device.

Note that the light-emitting device in this specification includes an image display device using a light-emitting element. A module in which a connector such as an anisotropic conductive film or a TCP (Tape Carrier Package) is connected to a light-emitting element, a module in which a printed wiring board is provided on the tip of a TCP, and a module in which an IC (integrated circuit) is directly mounted on a light-emitting element by a COG (Chip On Glass) method include a light-emitting device in some cases. Furthermore, in some cases, a lighting device or the like includes the light-emitting device.

Effect of the Invention

According to one embodiment of the present invention, a novel light-emitting device can be provided. According to one embodiment of the present invention, a light-emitting device or a display device having high display quality can be provided. According to one embodiment of the present invention, an electronic device including a display portion having high display quality can be provided.

Note that the descriptions of the effects do not disturb the existence of other effects. Note that one embodiment of the present invention does not need to have all these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 1(A) to FIG. 1(C) are conceptual diagrams of light-emitting devices.
FIG. 5(A) and FIG. 5(B) are schematic diagrams of active matrix light-emitting devices.
FIG. 7(A) to FIG. 7(C) are diagrams illustrating electronic devices.
FIG. 13(A) to FIG. 13(C) are schematic diagrams of light-emitting devices.
FIGS. 15(A) and 15(B) are conceptual diagrams of active matrix light-emitting devices.

MODE FOR CARRYING OUT THE INVENTION

Figure 2:
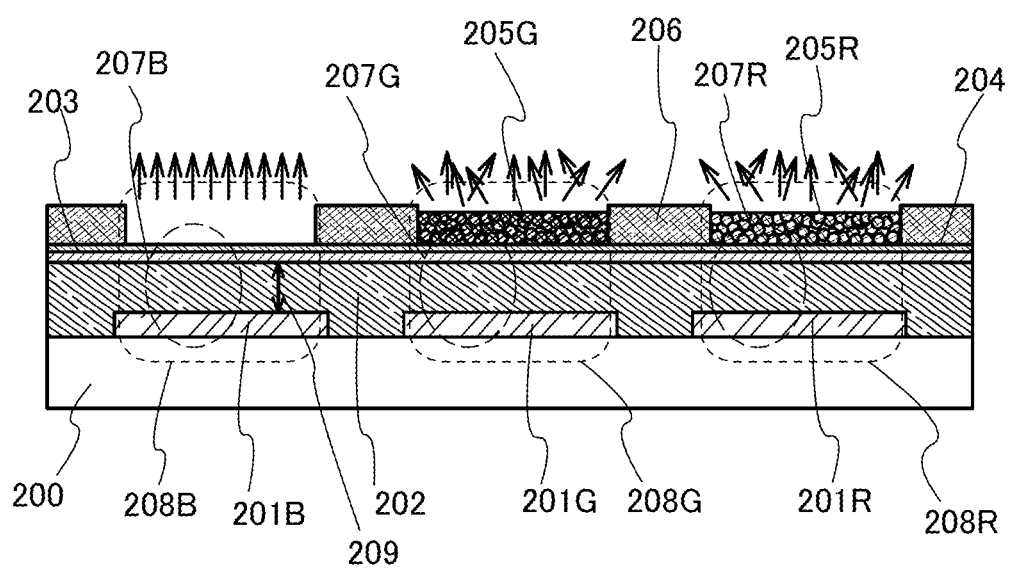
FIG. 2 is a conceptual diagram of a light-emitting device.

Embodiments of the present invention are described in detail below with reference to drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Embodiment 1

In a display using a color conversion layer using a full color technique, monochromatic light emission with high energy and a short wavelength (blue light or light having a shorter wavelength) is used. When such blue light emission can be directly utilized without using a color conversion layer, loss due to conversion does not occur, which brings advantage in efficiency.

Here, in consideration of color reproducibility of a full color display, in order to express a wider color gamut, it is essential to obtain light with high color purity. Light emitted from an organic compound has a broader spectrum than light emitted from an inorganic compound in many cases, and the spectrum is preferably narrowed with a microcavity structure in order to obtain light emission with sufficiently high color purity.

Actually, a light-emitting element using a suitable dopant and a microcavity structure appropriately can provide blue light emission based on the BT2020 standard with which almost all colors in nature can be reproduced.

Meanwhile, in recent years, color conversion technology using quantum dots (QDs) has been put into practical use in the field of liquid crystal displays and the like. A QD is a semiconductor nanocrystal with a size of several nanometers and contains approximately $1\times10^3$ to $1\times10^6$ atoms. A QD confines an electron, a hole, or an exciton, which results in discrete energy states and an energy shift depending on the size of a QD. This means that quantum dots made of the same substance emit light with different emission wavelengths depending on their sizes; thus, emission wavelengths can be easily adjusted by changing the sizes of QDs to be used.

A QD has an emission spectrum with a narrow peak width because its discreteness limits the phase relaxation, leading to light emission with high color purity. That is, with the use of a color conversion layer using a QD, light emission with high color purity can be obtained, and light emission based on the above BT2020 standard can be obtained.

The color conversion layer using a QD converts light emitted from a light-emitting element to light with a longer wavelength through photoluminescence in which light emitted from the light-emitting element is absorbed and then re-emitted, like a color conversion layer using an organic compound as a light-emitting substance.

Light whose spectrum is narrowed with a microcavity structure is known to have high directivity perpendicularly to a screen. On the other hand, light emitted through the color conversion layer using a QD hardly has directivity because light emitted from a QD or a light-emitting organic compound is emitted in all directions. Such large differences in alignment characteristics cause viewing angle dependence, which is directly linked to deterioration in display quality. In particular, the adverse influence is large in the case where a large number of people view a large-sized screen, such as a TV.

In view of the above, a light-emitting device of one embodiment of the present invention is a light-emitting device which includes a plurality of pixels and in which the pixel includes a light-emitting element, where the light-emitting element has a microcavity structure, and in the case where there exist a pixel from which light emitted from the light-emitting element is extracted through a color conversion layer and a pixel from which light is extracted without through a color conversion layer, at least the pixel from which light is emitted without through a color conversion layer has a structure having a function of scattering light.

The structure having a function of scattering light is provided on an optical path of light emitted from the light-emitting element to the outside of the light-emitting device. Although light emitted from the light-emitting element having a microcavity structure has high directivity, when light is scattered by the structure having a function of scattering light, its directivity can be reduced; as a result, light having alignment characteristics similar to those of light passing through a color conversion layer can be obtained. Accordingly, the above viewing angle dependence can be reduced.

One embodiment of the present invention is a light-emitting element including a first pixel which includes a first light-emitting element and a structure having a function of scattering light (light scattering structure); and a second pixel including a second light-emitting element and a first color conversion layer.

Although any structure may be used as the above structure having a function of scattering light as long as light from the first light-emitting element can be scattered, the structure is provided on an optical path of light emitted from the first light-emitting element to the outside of the light-emitting device as described above. For example, the structure may be provided in the same place as where the color conversion layer is provided, or if a sealing substrate is used, the sealing substrate may be provided with the structure. In the case where a sealing substrate of glass, an organic resin, or the like is used, a projection and a depression may be formed in a corresponding portion by a sandblasting method, an etching method, or the like so that light is scattered.

The structure having a function of scattering light may include a first substance that scatters light. The first substance may be, for example, an inorganic microparticle of titanium oxide, silicon oxide, or calcium carbonate, or an organic resin in which a colorless polymer microparticle of silicone, polystyrene, or acrylic is dispersed.

The size (particle diameter) of the first substance is preferably approximately 1 μm to 100 μm. Note that any organic resin may be used as long as the organic resin has a refractive index different from that of the above microparticle that scatters light, and an acrylic resin such as PMMA or a colorless and transparent resin such as polystyrene or polycarbonate is preferable. In the case where an acrylic resin such as PMMA is used as an organic resin, for example, a silicone microparticle or a polystyrene microparticle can be used as a microparticle that scatters light, in addition to the above inorganic microparticle. Alternatively, in the case where polystyrene or polycarbonate is used as an organic resin, a silicone microparticle or an acrylic microparticle can be used as a microparticle that scatters light, in addition to the above inorganic microparticle.

The first color conversion layer is a layer including a second substance that emits light with a different wavelength by absorbing light from the second light-emitting element. As the substance, a variety of inorganic and organic light-emitting substances that exhibit photoluminescence can be used. In particular, a quantum dot (QD) is particularly preferable because the emission spectrum has a narrow peak width and light emission with high color purity can be obtained, the QD has high inherent stability since it is an inorganic substance, and the theoretical internal quantum efficiency is approximately 100%, for example. The color conversion layer can be formed in such a manner that a solvent in which quantum dots are dispersed is applied and drying and baking are performed. In addition, a sheet in which quantum dots are dispersed in advance has also been developed. Separate coloring is performed by a droplet discharge method such as ink-jet, a printing method, or etching using photolithography or the like after application on a formation surface and solidification such as drying, baking, or fixation, for example.

Examples of the quantum dot include nano-sized particles of a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, semiconductor clusters, metal halide perovskites, and the like.

Specific examples include, but are not limited to, cadmium selenide (CdSe), cadmium sulfide (CdS), cadmium telluride (CdTe), zinc selenide (ZnSe), zinc oxide (ZnO), zinc sulfide (ZnS), zinc telluride (ZnTe), mercury sulfide (HgS), mercury selenide (HgSe), mercury telluride (HgTe), indium arsenide (InAs), indium phosphide (InP), gallium arsenide (GaAs), gallium phosphide (GaP), indium nitride (InN), gallium nitride (GaN), indium antimonide (InSb), gallium antimonide (GaSb), aluminum phosphide (AlP), aluminum arsenide (AlAs), aluminum antimonide (AlSb), lead(II) selenide (PbSe), lead(II) telluride (PbTe), lead(II) sulfide (PbS), indium selenide ($In_2Se_3$), indium telluride ($In_2Te_3$), indium sulfide ($In_2S_3$), gallium selenide ($Ga_2Se_3$), arsenic(III) sulfide ($As_2S_3$), arsenic(III) selenide ($As_2Se_3$), arsenic(III) telluride ($As_2Te_3$), antimony(III) sulfide ($Sb_2S_3$), antimony(III) selenide ($Sb_2Se_3$), antimony(III) telluride ($Sb_2Te_3$), bismuth(III) sulfide ($Bi_2S_3$), bismuth(III) selenide ($Bi_2Se_3$), bismuth(III) telluride ($Bi_2Te_3$), silicon (Si), silicon carbide (SiC), germanium (Ge), tin (Sn), selenium (Se), tellurium (Te), boron (B), carbon (C), phosphorus (P), boron nitride (BN), boron phosphide (BP), boron arsenide (BAs), aluminum nitride (AlN), aluminum sulfide ($Al_2S_3$), barium sulfide (BaS), barium selenide (BaSe), barium telluride (BaTe), calcium sulfide (CaS), calcium selenide (CaSe), calcium telluride (CaTe), beryllium sulfide (BeS), beryllium selenide (BeSe), beryllium telluride (BeTe), magnesium sulfide (MgS), magnesium selenide (MgSe), germanium sulfide (GeS), germanium selenide (GeSe), germanium telluride (GeTe), tin(IV) sulfide ($SnS_2$), tin(II) sulfide (SnS), tin(II) selenide (SnSe), tin(II) telluride (SnTe), lead(II) oxide (PbO), copper(I) fluoride (CuF), copper(I) chloride (CuCl), copper(I) bromide (CuBr), copper(I) iodide (CuI), copper(I) oxide ($Cu_2O$), copper(I) selenide ($Cu_2Se$), nickel(II) oxide (NiO), cobalt(II) oxide (CoO), cobalt(II) sulfide (CoS), triiron tetraoxide ($Fe_3O_4$), iron(II) sulfide (FeS), manganese(II) oxide (MnO), molybdenum (IV) sulfide ($MoS_2$), vanadium(II) oxide (VO), vanadium (IV) oxide ($VO_2$), tungsten(IV) oxide ($WO_2$), tantalum(V) oxide ($Ta_2O_5$), titanium oxide ($TiO_2$, $Ti_2O_5$, $Ti_2O_3$, $Ti_5O_9$, or the like), zirconium oxide ($ZrO_2$), silicon nitride ($Si_3N_4$), germanium nitride ($Ge_3N_4$), aluminum oxide ($Al_2O_3$), barium titanate ($BaTiO_3$), a compound of selenium, zinc, and cadmium (CdZnSe), a compound of indium, arsenic, and phosphorus (InAsP), a compound of cadmium, selenium, and sulfur (CdSeS), a compound of cadmium, selenium, and tellurium (CdSeTe), a compound of indium, gallium, and arsenic (InGaAs), a compound of indium, gallium, and selenium (InGaSe), a compound of indium, selenium, and sulfur (InSeS), a compound of copper, indium, and sulfur (e.g., $CuInS_2$), and combinations thereof. What is called an alloyed quantum dot, whose composition is represented by a given ratio, may be used. For example, an alloyed quantum dot represented by $CdS_xSe_{(1-x)}$ (x is a given number between 0 and 1) is an effective means for obtaining blue light emission because its emission wavelength can be changed by changing x.

As the structure of the quantum dot, any of a core type, a core-shell type, a core-multishell type, and the like may be used. When a core is covered with a shell formed of another inorganic material having a wider band gap, the influence of defects and dangling bonds existing at the surface of a nanocrystal can be reduced. Since this can significantly improve the quantum efficiency of light emission, it is preferable to use a core-shell or core-multishell quantum dot. Examples of the material of a shell include zinc sulfide (ZnS) and zinc oxide (ZnO).

Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It is also possible to reduce reactivity and improve electrical stability. Examples of the protective agent (or the protective group) include polyoxyethylene alkyl ethers such as polyoxyethylene lauryl ether, polyoxyethylene stearyl ether, and polyoxyethylene oleyl ether; trialkylphosphines such as tripropylphosphine, tributylphosphine, trihexylphosphine, and trioctylphoshine; polyoxyethylene alkylphenyl ethers such as polyoxyethylene n-octylphenyl ether and polyoxyethylene n-nonylphenyl ether; tertiary amines such as tri(n-hexyl)amine, tri(n-octyl)amine, and tri(n-decyl)amine; organophosphorus compounds such as tripropylphosphine oxide, tributylphosphine oxide, trihexylphosphine oxide, trioctylphosphine oxide, and tridecylphosphine oxide; polyethylene glycol diesters such as polyethylene glycol dilaurate and polyethylene glycol distearate; organic nitrogen compounds such as nitrogen-containing aromatic compounds, e.g., pyridines, lutidines, collidines, and quinolines; aminoalkanes such as hexylamine, octylamine, decylamine, dodecylamine, tetradecylamine, hexadecylamine, and octadecylamine; dialkylsulfides such as dibutylsulfide; dialkylsulfoxides such as dimethylsulfoxide and dibutylsulfoxide; organic sulfur compounds such as sulfur-containing aromatic compounds, e.g., thiophene; higher fatty acids such as a palmitin acid, a stearic acid, and an oleic acid; alcohols; sorbitan fatty acid esters; fatty acid modified polyesters; tertiary amine modified polyurethanes; and polyethyleneimines.

In the case where the second substance that is included in the first color conversion layer and emits light by absorbing light emitted from the second light-emitting element is an organic compound, the organic compound has an absorption spectrum peculiar to the substance, and thus it is preferable that light emission corresponding to the absorption be obtained from the second light-emitting element.

In the case where the second substance included in the first color conversion layer is an inorganic compound, in particular, a QD, the QD has a continuous absorption spectrum, in which absorption intensity becomes higher as the wavelength of light becomes shorter, from the emission wavelength of the QD toward the shorter wavelength side. Therefore, light emitted from the second light-emitting element has a shorter emission wavelength than light emitted from the first color conversion layer. Thus, an emission center substance in each light-emitting element may be common; therefore, light-emitting elements do not need to be separately formed for each pixel, so that a light-emitting device can be manufactured at relatively low cost.

In the case where light-emitting elements are not separately formed for each pixel as described above, light emission of the emission center substance included in the light-emitting elements is blue light (the emission peak wavelength is approximately 420 nm to 480 nm. The light emission of the emission center substance is calculated from a PL spectrum in a solution state. Since the relative dielectric constant of the organic compound included in the EL layer of the light-emitting element is approximately 3, in order to prevent inconsistency with the emission spectrum of the light-emitting element the relative dielectric constant of the solvent for bringing the emission center substance into a solution state is preferably greater than or equal to 1 and less than or equal to 10, further preferably greater than or equal to 2 and less than or equal to 5 at room temperature. Specific examples include hexane, benzene, toluene, diethyl ether, ethyl acetate, chloroform, chlorobenzene, and dichloromethane. It is further preferable that the solvent have a relative dielectric constant greater than or equal to 2 and less than or equal to 5 at room temperature, have high solubility, and be versatile. For example, toluene or chloroform is further preferable. In the first pixel, light from the first light-emitting element is extracted to the outside of the light-emitting device without through a color conversion layer, and thus among three colors of light necessary for achievement of full color, the emitted light is preferably blue light having the highest energy because of small loss. When the microcavity structure of the light-emitting element is configured to enhance blue light, a light-emitting device with high color purity and high efficiency can be obtained.

The microcavity structure can be formed in such a manner that one of a pair of electrodes of the light-emitting element serves as a reflective electrode and the other serves as a semi-transmissive and semi-reflective electrode. The wavelength of light to be intensified can be adjusted by forming an EL layer or an optical path length adjustment layer (e.g., a transparent electrode) such that the optical distance between an interface of the reflective electrode on the semi-transmissive and semi-reflective electrode side and an interface of the semi-transmissive and semi-reflective electrode on the reflective electrode side is the integral multiple of λ/2 (λ corresponds to the wavelength of light, the unit (nm)).

Note that the light-emitting element of one embodiment of the present invention may include a third pixel or further pixels. The third pixel includes a third light-emitting element and a second color conversion layer and exhibits light with a wavelength different from the wavelengths of light from the first pixel and the second pixel. As the second color conversion layer has a configuration similar to that of the first color conversion layer except color of emitted light, and the third light-emitting element has a configuration similar to that of the second light-emitting element, the above can be referred to.

Next, an example of a light-emitting device which is one embodiment of the present invention will be described in detail below with reference to the drawings.

FIG. 2 illustrates a conceptual diagram of a conventional light-emitting device. FIG. 2 illustrates, as an example, pixels exhibiting light of three colors, blue, green, and red. A reference numeral 208B denotes a first pixel that exhibits blue light emission. The first pixel 208B includes a first electrode 201B and a second electrode 203. One of them serves as a reflective electrode and the other serves as a semi-transmissive and semi-reflective electrode. One of them serves as an anode and the other serves as a cathode. Similarly, a second pixel 208G that exhibits green light emission and a third pixel 208R that exhibits red light emission are also illustrated, and include, respectively, a first electrode 201G and the second electrode 203, and a first electrode 201R and the second electrode 203. FIG. 2 illustrates, as an example, a configuration in which the first electrodes 201B, 201G, and 201R are reflective electrodes and serve as anodes, and the second electrode 203 is a semi-transmissive and semi-reflective electrode. The first electrodes 201B to 201R are formed over an insulator 200. A black matrix 206 is preferably provided between adjacent pixels to prevent mixing of light of the adjacent pixels. The black matrix 206 may also serve as a bank for forming a color conversion layer by an ink-jet method or the like.

In the first pixel 208B to the third pixel 208R, the EL layer 202 is interposed between the second electrode 203 and the first electrodes 201B, 201G, and 201R. The EL layer 202 may be either one or separated in the first pixel 208B to the third pixel 208R; however, a structure in which one EL layer 202 is used in common between a plurality of pixels can be manufactured more easily and is advantageous in cost. Although the EL layer 202 generally consists of a plurality of layers having different functions, some of them may be used in common and the others of them may be independent between a plurality of pixels.

The first pixel 208B to the third pixel 208R include, respectively, a first light-emitting element 207B to a third light-emitting element 207R each consisting of the first electrode, the second electrode, and the EL layer. Note that FIG. 2 illustrates the configuration in which the first pixel 208B to the third pixel 208R include the EL layer 202 in common.

Each of the first light-emitting element 207B to the third light-emitting element 207R is a light-emitting element having a microcavity structure because one of the first electrode and the second electrode is a reflective electrode and the other is a semi-transmissive and semi-reflective electrode. A wavelength which can be resonated is determined by an optical distance 209 between a surface of the reflective electrode and a surface of the semi-transmissive and semi-reflective electrode in the light-emitting element. When the wavelength which is desired to be resonated is set to λ and the distance is set to the integral multiple of λ/2, light with the wavelength λ can be amplified. The optical distance 209 can be adjusted by a hole-injection layer or a hole-transport layer which is included in the EL layer, a transparent electrode layer which is formed over a reflective electrode as part of the first electrode, or the like. The light-emitting device in FIG. 2 can be formed easily because the EL layer is used in common between the first light-emitting element 207B to the third light-emitting element 207R, and the emission center substance is also the same, so that the optical distance 209 of the light-emitting element is the same between the first pixel 208B to the third pixel 208R. Note that in the case where the EL layers 202 are separately formed for the respective pixels, the optical distance 209 is adjusted in accordance with light from the EL layer.

A reference numeral 204 denotes a layer provided over the second layer 203, which is a protection layer for protecting the first light-emitting element 207B to the third light-emitting element 207R from a substance or an environment that adversely affects them. An oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide; a material containing aluminum nitride, hafnium nitride, silicon nitride, tantalum nitride, titanium nitride, niobium nitride, molybdenum nitride, zirconium nitride, gallium nitride; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

A reference numeral 205G denotes a color conversion layer. The color conversion layer 205G includes the second substance that emits light by absorbing light from the second light-emitting element 207G. Light emitted from the second light-emitting element 207G enters the first color conversion layer 205G, is converted to light with a longer wavelength, and is extracted. Similarly, a reference numeral 205R denotes a color conversion layer, and the color conversion layer 205R includes a third substance that emits light by absorbing light from the third light-emitting element 207R. Light emitted from the third light-emitting element 207R enters the second color conversion layer 205R, is converted to light with a longer wavelength, and is extracted.

Note that the first pixel 208B emits light without through a color conversion layer, and thus is preferably a pixel that emits blue light, which has the highest energy among three primary colors of light. For the same reason, in the case where the first light-emitting element 208B to the third light-emitting element 208R emit light of the same color, the emission color is preferably blue. In that case, use of the same substance as the emission center substances included in the light-emitting elements is advantageous in cost; however, different emission center substances may be used.

Since the first light-emitting element 207B to the third light-emitting element 207R have a microcavity structure, the emitted light has directivity in a direction perpendicular to the electrode. The first pixel 208B emits light as it is to the outside of the light-emitting device and thus extracts light having directivity. On the other hand, since light from the second light-emitting element 207G and the third light-emitting element 207R is extracted to the outside of the light-emitting device through the first color conversion layer 205G and the second color conversion layer 205R in the second pixel 208G and the third pixel 208R, the light from the pixels has no directivity. That is, in the pixels included in one light-emitting device, emitted light having high directivity and emitted light having little directivity coexist.

When the pixels having different alignment characteristics coexist as described above, the display performance significantly deteriorates depending on a viewing angle. In particular, in the case where the alignment characteristics differ between the colors as in the light-emitting device illustrated in FIG. 2, a completely different color may be seen depending on a viewing angle.

Here, in each of the light-emitting devices of one embodiment of the present invention illustrated in FIGS. 1(A) to 1(C), a structure 205B having a function of scattering light emitted from the first light-emitting element 207B is provided in the first pixel 208B. The structure 205B having a function of scattering light emitted from the first light-emitting element 207B may be a layer including the first substance that scatters light emitted from the first light-emitting element, as illustrated in FIGS. 1(A) and 1(B) or may have a structure body which scatters light emitted from the first light-emitting element, as illustrated in FIG. 1(C).

FIGS. 13(A) to 13(C) illustrate modification examples. In FIG. 13(A), a layer 215B also serving as a blue color filter instead of the structure 205B having a function of scattering light in FIG. 1(A) is included. FIGS. 13(B) and 13(C) illustrate states each including the structure 205B having a function of scattering light and a blue color filter 225B. Note that the blue color filter 225B may be in contact with the structure 205B having a function of scattering light, as illustrated in FIGS. 13(B) and 13(C), or may be formed on another structure body such as a sealing substrate. Thus, the light-emitting device has improved color purity while scattering light having directivity. Furthermore, reflection of external light can also be suppressed, leading to preferable display.

Light from the first pixel 208B can be light with low directivity because light from the first light-emitting element 207B is extracted through the structure 205B and the layer 215B. This relieves a difference in alignment characteristics depending on colors, and leads to a light-emitting device with high display quality.

As described above, the light-emitting device of one embodiment of the present invention can have high display quality.

Embodiment 2

A light-emitting device of one embodiment of the present invention includes a plurality of pixels each including a light-emitting element, and the light-emitting element has a microcavity structure and in the case where there exist a pixel that emits light from the light-emitting element through a color conversion layer and a pixel that emits light without through a color conversion layer, a semi-transmissive and semi-reflective layer is provided so that the color conversion layer is interposed, whereby the microcavity structure is formed.

When a microcavity structure is provided for the color conversion layer, light extracted from the color conversion layer can have directivity similar to that of light emitted from the light-emitting element, so that light passing through the color conversion layer and light not passing through the color conversion layer can have similar alignment characteristics. Accordingly, the viewing angle dependence can be reduced.

One embodiment of the present invention is a light-emitting element including at least a first pixel which includes a first light-emitting element; and a second pixel which includes a second light-emitting element, a first color conversion layer, and a means for imparting directivity to light emitted from the first color conversion layer.

Although any means may be used as the means for imparting directivity to light emitted from the first color conversion layer as long as directivity can be imparted to light emitted from the first color conversion layer, a semi-transmissive and semi-reflective layer is preferably formed so that the color conversion layer is interposed, as described above.

The visible light reflectance of the semi-transmissive and semi-reflective layer is 20% to 80%, preferably 40% to 70%. The electrode on a side where light of the light-emitting element passes through may also serve as the semi-transmissive and semi-reflective layer. Alternatively, as the semi-transmissive and semi-reflective layer, a dielectric multilayer film may be used. The dielectric multilayer film is a film in which two kinds of dielectric films having different refractive indexes are alternately stacked a plurality of times. The optical thickness of each dielectric film is designed to be ¼ of a desired emission wavelength, whereby the reflectance of light at a desired emission wavelength can be increased, and directivity can be imparted to the light. Specifically, a film in which a film having a low refractive index, such as a silicon oxide or a magnesium fluoride, and a film having a high refractive index, such as a tantalum oxide, a titanium oxide, or a hafnium oxide, are alternately stacked, and the like can be given.

The above first color conversion layer has the same configuration as the first color conversion layer described in Embodiment 1; therefore, the description thereof is not repeated.

In the case where light-emitting elements are not separately formed for each pixel, as light emitted from the emission center substance included in the light-emitting element, blue light (the emission peak wavelength is approximately 420 nm to 480 nm. The light emission of the emission center substance is calculated from a PL spectrum in a solution state. Since the relative dielectric constant of the organic compound included in the EL layer of the light-emitting element is approximately 3, in order to prevent inconsistency with the emission spectrum of the light-emitting element, the relative dielectric constant of the solvent for bringing the emission center substance into a solution state is preferably greater than or equal to 1 and less than or equal to 10, further preferably greater than or equal to 2 and less than or equal to 5 at room temperature. Specific examples include hexane, benzene, toluene, diethyl ether, ethyl acetate, chloroform, chlorobenzene, and dichloromethane. It is further preferable that the solvent have a relative dielectric constant greater than or equal to 2 and less than or equal to 5 at room temperature, have high solubility, and be versatile. For example, toluene or chloroform is further preferable) is preferable. In the first pixel, light from the first light-emitting element is extracted to the outside of the light-emitting device without through a color conversion layer, and thus among three colors of light necessary for achievement of full color, the emitted light is preferably blue light, which has the highest energy, because of small loss. When the microcavity structure of the light-emitting element is configured to enhance blue light, a light-emitting device with high color purity and high efficiency can be obtained.

The microcavity structure of the light-emitting element can be formed in such a manner that one of a pair of electrodes of the light-emitting device serves as a reflective electrode and the other serves as a semi-transmissive and semi-reflective electrode. The wavelength of light to be intensified can be adjusted by forming an EL layer or an optical path length adjustment layer (e.g., a transparent electrode) such that the optical distance between an interface of the reflective electrode on the semi-transmissive and semi-reflective electrode side and an interface of the semi-transmissive and semi-reflective electrode on the reflective electrode side is the integral multiple of $\lambda/2$ ($\lambda$ corresponds to the wavelength of light, the unit (nm)). The semi-transmissive and semi-reflective electrode of the light-emitting element may be used as one of the semi-transmissive and semi-reflective layers between which the color conversion layer is interposed.

Note that the light-emitting element of one embodiment of the present invention may include a third pixel or further pixels. The third pixel includes a third light-emitting element and a second color conversion layer and exhibits light with a wavelength different from the wavelengths of light from the first pixel and the second pixel. As the second color conversion layer has a configuration similar to that of the first color conversion layer except color of emitted light, and the third light-emitting element has a configuration similar to that of the second light-emitting element, the above can be referred to.

Next, an example of a light-emitting device which is one embodiment of the present invention will be described in detail below with reference to the drawings.

FIG. 2 illustrates a conceptual diagram of a conventional light-emitting device. FIG. 2 illustrates, as an example, pixels exhibiting light of three colors, blue, green, and red. A reference numeral 208B denotes a first pixel that exhibits blue light emission. The first pixel 208B includes a first electrode 201B and a second electrode 203. One of them serves as a reflective electrode and the other serves as a semi-transmissive and semi-reflective electrode. One of them serves as an anode and the other serves as a cathode. Similarly, a second pixel 208G that exhibits green light emission and a third pixel 208R that exhibits red light emission are also illustrated, and include, respectively, a first electrode 201G and the second electrode 203, and a first electrode 201R and the second electrode 203. FIG. 2 illustrates, as an example, a configuration in which the first electrodes 201B, 201G, and 201R are reflective electrodes and serve as anodes, and the second electrode 203 is a semi-transmissive and semi-reflective electrode. The first electrodes 201B to 201R are formed over an insulator 200. A black matrix 206 is preferably provided between adjacent pixels to prevent mixing of light of the adjacent pixels. The black matrix 206 may also serve as a bank for forming a color conversion layer by an ink-jet method or the like.

In the first pixel 208B to the third pixel 208R, the EL layer 202 is interposed between the second electrode 203 and the first electrodes 201B, 201G, and 201R. The EL layer 202 may be either one or separated in the first pixel 208B to the third pixel 208R; however, a configuration in which one EL layer 202 is used in common between a plurality of pixels can be manufactured more easily and is advantageous in cost. Although the EL layer 202 generally consists of a plurality of layers having different functions, some of them may be used in common and the others of them may be independent between a plurality of pixels.

The first pixel 208B to the third pixel 208R include, respectively, the first light-emitting element 207B to the third light-emitting element 207R each consisting of the first electrode, the second electrode, and the EL layer. Note that FIG. 2 illustrates the configuration in which the first pixel 208B to the third pixel 208R include the EL layer 202 in common.

Each of the first light-emitting element 207B to the third light-emitting element 207R is a light-emitting element having a microcavity structure because one of the first electrode and the second electrode is a reflective electrode and the other is a semi-transmissive and semi-reflective electrode. A wavelength which can be resonated is determined by the optical distance 209 between a surface of the reflective electrode and a surface of the semi-transmissive and semi-reflective electrode in the light-emitting element. When the wavelength which is desired to be resonated is set to $\lambda$ and the distance is set to the integral multiple of $\lambda/2$, light with the wavelength $\lambda$ can be amplified. The optical distance 209 can be adjusted by a hole-injection layer or a hole-transport layer which is included in the EL layer, a transparent electrode layer which is formed over a reflective electrode as part of the first electrode, or the like. The light-emitting device in FIG. 2 can be formed easily because the EL layer is used in common between the first light-emitting element 207B to the third light-emitting element 207R, and the emission center substance is also the same, so that the optical distance 209 of the light-emitting element is the same between the first pixel 208B to the third pixel 208R. Note that in the case where the EL layers 202 are separately formed for the respective pixels, the optical distance 209 is adjusted in accordance with light from the EL layer.

The reference numeral 204 denotes a layer provided over the second layer 203, which is a protection layer for protecting the first light-emitting element 207B to the third light-emitting element 207R from a substance or an environment that adversely affects them. An oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide; a material containing aluminum nitride, hafnium nitride, silicon nitride, tantalum nitride, titanium nitride, niobium nitride, molybdenum nitride, zirconium nitride, gallium nitride; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The reference numeral 205G denotes a color conversion layer. The color conversion layer 205G includes the second substance that emits light by absorbing light from the second light-emitting element 207G. Light emitted from the second light-emitting device 207G enters the first color conversion layer 205G, is converted to light with a longer wavelength, and is extracted. Similarly, the reference numeral 205R denotes a color conversion layer, and the color conversion layer 205R includes a third substance that emits light by absorbing light from the third light-emitting element 207R. Light emitted from the third light-emitting element 207R enters the second color conversion layer 205R, is converted to light with a longer wavelength, and is extracted.

Note that the first pixel 208B emits light without through a color conversion layer, and thus is preferably a pixel that emits blue light, which has the highest energy among three primary colors of light. For the same reason, in the case where the first light-emitting element 208B to the third light-emitting element 208R emit light of the same color, the emission color is preferably blue. In that case, use of the same substance as the emission center substances included in the light-emitting elements is advantageous in cost; however, different emission center substances may be used.

Since the first light-emitting element 207B to the third light-emitting element 207R have a microcavity structure, the emitted light has directivity in a direction perpendicular to the electrode. The first pixel 208B emits light as it is to the outside of the light-emitting device and thus extracts light having directivity. On the other hand, since light from the second light-emitting element 207G and the third light-emitting element 207R is extracted to the outside of the light-emitting device through the first color conversion layer 205G and the second color conversion layer 205R in the second pixel 208G and the third pixel 208R, the light from the pixels has no directivity. That is, in the pixels included in one light-emitting device, emitted light having high directivity and emitted light having little directivity coexist.

When the pixels having different alignment characteristics coexist as described above, the display performance significantly deteriorates depending on a viewing angle. In particular, in the case where the alignment characteristics differ between the colors as in the light-emitting device illustrated in FIG. 2, a completely different color may be seen depending on a viewing angle.

Figure 14A:
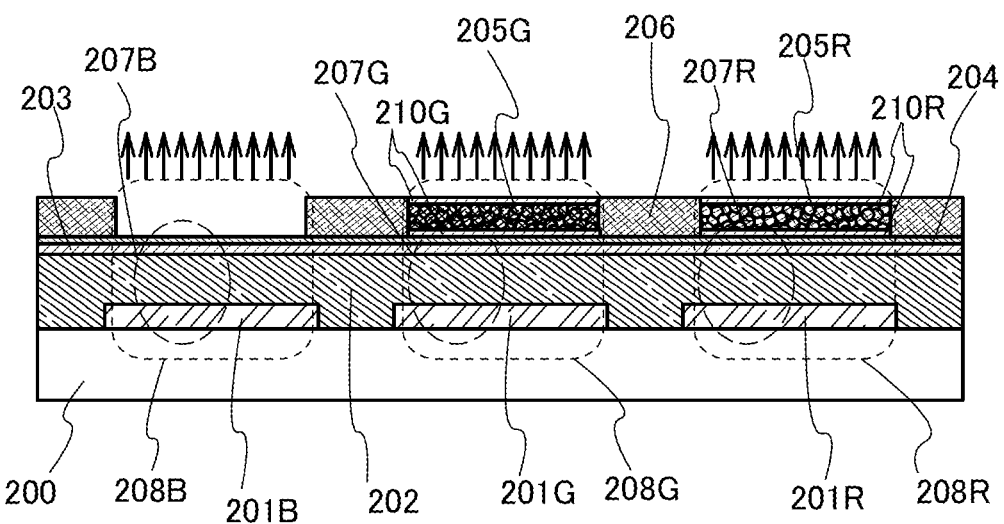
FIGS. 14(A) and 14(B) are conceptual diagrams of light-emitting devices.
Figure 14B:
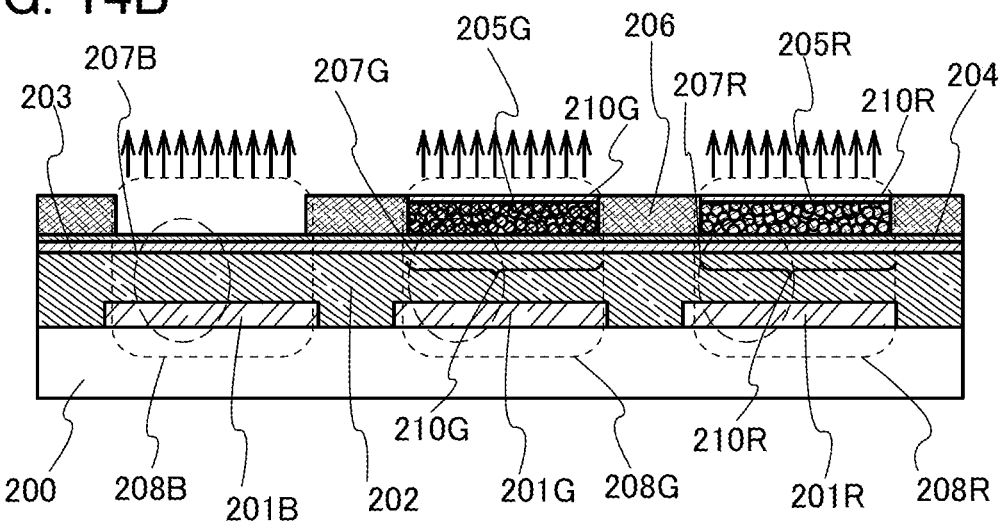

Here, in each of light-emitting devices of one embodiment of the present invention illustrated in FIGS. 14(A) and 14(B), a means for imparting directivity to light emitted from the first color conversion layer is provided. Any means may be used as the means for imparting directivity to light emitted from the first color conversion layer. For example, a microcavity structure is formed by forming a semi-transmissive and semi-reflective layer such that the color conversion layer is interposed. Note that FIG. 14(A) illustrates a mode in which semi-transmissive and semi-reflective layers are formed below and above the color conversion layer, and FIG. 14(B) illustrates a mode in which a semi-transmissive and semi-reflective film of the color conversion layer on the light-emitting element side also serves as the second electrode (semi-transmissive and semi-reflective electrode) of the light-emitting element.

Light from the second pixel 208G and the third pixel 208R can be light with high directivity by providing means 210G and 210R for imparting directivity to light emitted from the color conversion layer. This relieves a difference in alignment characteristics depending on colors, and leads to a light-emitting device with high display quality.

As described above, the light-emitting device of one embodiment of the present invention can have high display quality.

Embodiment 3

Figure 3A:
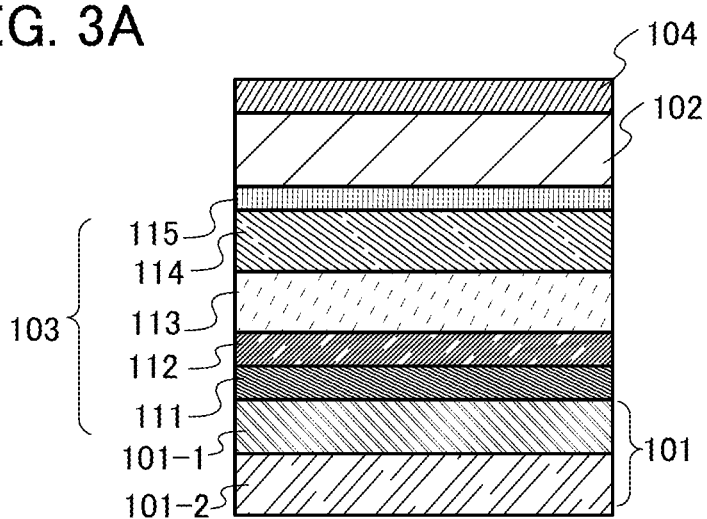
FIG. 3(A) to FIG. 3(D) are schematic diagrams of light-emitting elements.

Next, a light-emitting element used in a light-emitting device of one embodiment of the present invention will be described in detail. The light-emitting element in this embodiment includes a pair of electrodes of a first electrode 101 and a second electrode 102 and an EL layer 103 provided between the first electrode 101 and the second electrode 102. In FIG. 3(A), the electrode provided on the formation substrate side is referred to as the first electrode 101.

The light-emitting device of one embodiment of the present invention includes a light-emitting element having a microcavity structure. The light-emitting element with a microcavity structure can be obtained with use of a reflective electrode and a semi-transmissive and semi-reflective electrode as a pair of electrodes of the light-emitting element. The reflective electrode and the semi-transmissive and semi-reflective electrode correspond to the first electrode 101 and the second electrode 102 described above. The light-emitting device includes at least an EL layer between the reflective electrode and the semi-transmissive and semi-reflective electrode, and the EL layer includes at least a light-emitting layer serving as a light-emitting region. Note that one of the first electrode 101 and the second electrode 102 functions as an anode, and the other functions as a cathode.

In the light-emitting element with a microcavity structure, light extracted in all directions from the light-emitting layer included in the EL layer is reflected and resonated by the reflective electrode and the semi-transmissive and semi-reflective electrode, whereby light with a certain wavelength is amplified, and the light has directivity.

Note that the reflective electrode has a visible light reflectivity of 40% to 100%, preferably 70% to 100%, and a resistivity of $1 \times 10^{-2}$ Ωcm or lower. Examples of a material forming the reflective electrode include aluminum (Al) or an alloy containing Al. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Furthermore, silver (Ag), an alloy containing Ag and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), and gold (Au)), or the like may be used. Examples of the alloy containing silver include an alloy containing silver, palladium, and copper, an alloy containing silver and copper, an alloy containing silver and magnesium, an alloy containing silver and nickel, an alloy containing silver and gold, and an alloy containing silver and ytterbium. Besides, a transition metal such as tungsten, chromium (Cr), molybdenum (Mo), copper, or titanium can be used.

Note that as an optical path length adjustment layer, a transparent electrode layer may be formed using a light-transmitting conductive material between the reflective electrode and the EL layer 103, and two layers of the reflective electrode and the transparent electrode can serve as the first electrode 101. With the use of the transparent electrode layer, the optical path length of the microcavity structure (the cavity length) can also be adjusted. As a light-transmitting conductive material, a metal oxide such as indium tin oxide (hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be given. In FIG. 3(A), the first electrode 101 includes a reflective electrode 101-1 and a transparent electrode 101-2.

In addition, the semi-transmissive and semi-reflective electrode has a visible light reflectivity of 20% to 80%, preferably 40% to 70%, and a resistivity of $1 \times 10^{-2}$ Ωcm or lower. For example, one or more kinds of conductive metals and alloys, conductive compounds, and the like can be used as the semi-transmissive and semi-reflective electrode. Specifically, a metal oxide such as indium tin oxide (hereinafter, referred to as ITO), indium tin oxide containing silicon or silicon oxide (abbreviation: ITSO), indium oxide-zinc oxide (Indium Zinc Oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and Yb, or the like can be used.

The reflective electrode can be either one of the first electrode 101 and the second electrode 102 and the semi-transmissive and semi-reflective electrode may be the other. Moreover, the reflective electrode may be either one of an anode and a cathode and the semi-transmissive and semi-reflective electrode may be the other. FIG. 3(A) illustrates a case where the first electrode 101 is on the formation substrate side as described above; thus, the light-emitting element has a top emission structure when the reflective electrode is the first electrode, and the light-emitting element has a bottom emission structure when the reflective electrode is the second electrode 102. Note that although the first electrode 101 and the second electrode 102 may serve as either an anode or a cathode, FIG. 3(A) shows a case where the first electrode 101 is an anode.

Note that when the light-emitting element has a top-emission structure, the light extraction efficiency can be improved by providing an organic cap layer 104 on a surface of the second electrode 102 which is opposite to a surface in contact with the EL layer 103. When the organic cap layer 104 is provided in contact with the electrode 102 in the light-emitting element, the difference in refractive index at the interface between the electrode 102 and the air can be reduced, resulting in improvement in light extraction efficiency. The thickness is preferably greater than or equal to 5 nm and less than or equal to 120 nm. Further preferably, the thickness is greater than or equal to 30 nm and less than or equal to 90 nm. An organic compound layer including a substance with a molecular weight greater than or equal to 300 and less than or equal to 1200 is preferably used as the organic cap layer 104. Furthermore, the organic cap layer is preferably formed using a conductive organic material. In the configuration, the second electrode 102 is the semi-transmissive and semi-reflective electrode, which needs a thin thickness so as to ensure a certain light-transmitting property, and conductivity might be decreased in some cases. With use of a conductive material for the organic cap layer 104, while the light extraction efficiency is improved, the conductivity can be ensured and the manufacturing yield of the light-emitting element can be improved. Note that an organic compound that is less likely to absorb light in a visible light region can be favorably used. For the organic cap layer, the organic compound used for the EL layer 103 can also be used for the organic cap layer 104. In that case, the organic cap layer 104 can be formed with a deposition device or a deposition chamber for forming the EL layer 103, so that the organic cap layer 104 can be easily formed.

Figure 3B:
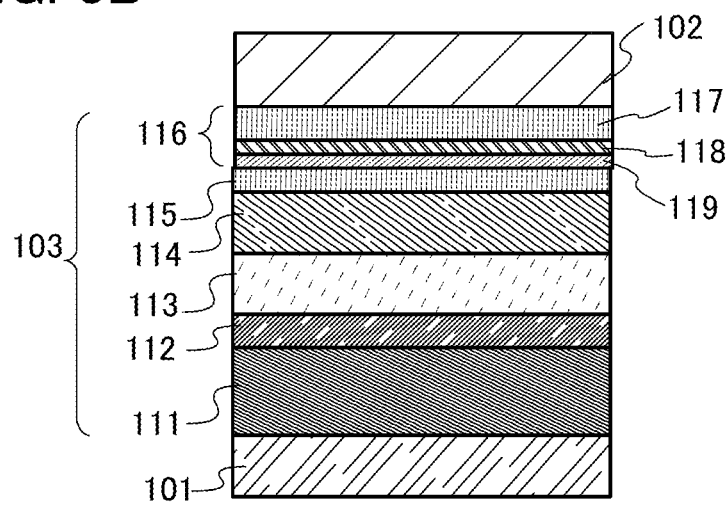

In the light-emitting element, by changing the thickness of the transparent electrode provided in contact with the above-described reflective electrode and the thicknesses of carrier-transport layers, such as a hole-injection layer and a hole-transport layer, the optical distance (cavity length) between the reflective electrode and the semi-transmissive and semi-reflective electrode can be changed. Thus, light with a wavelength that is resonated between the reflective electrode and the semi-transmissive and semi-reflective electrode can be intensified while light with a wavelength that is not resonated therebetween can be attenuated. FIG. 3(A) illustrates an example in which the optical path length is adjusted by the transparent electrode 101-2, which is a part of the first electrode 101; however, the optical path length may be adjusted by a hole-injection layer 111 as shown in FIG. 3(B) or by a hole-transport layer 112, or a combination of two or more of them may be used.

Note that in the microcavity structure, the optical distance (optical path length) between an interface of the reflective electrode on the EL layer side and an interface of the semi-transmissive and semi-reflective electrode on the EL layer side is preferably the integral multiple of λ/2 when a wavelength desired to be amplified is λ nm.

Note that in light emission, light that is reflected back by the reflective electrode (first reflected light) considerably interferes with light that directly enters the semi-transmissive and semi-reflective electrode from the light-emitting layer (first incident light); therefore, the optical path length between the reflective electrode and the light-emitting layer is preferably adjusted to (2n−1)λ/4 (n is a natural number of 1 or larger and λ is a wavelength of light emission to be amplified). By adjusting the optical path length, the phases of the first reflected light and the first incident light can be aligned with each other and the light emitted from the light-emitting layer can be further amplified.

With the microcavity structure, emission intensity with a specific wavelength in the front direction can be increased, whereby power consumption can be reduced. Furthermore, the probability of light incident to the color conversion layer can be increased.

Although the EL layer 103 preferably has a stacked structure, there is no particular limitation on the stacked structure, and various layer structures such as a hole-injection layer, a hole-transport layer, an electron-transport layer, an electron-injection layer, a carrier-blocking layer, an exciton-blocking layer, and a charge-generation layer can be employed. In this embodiment, two kinds of stacked-layer configurations are described: the configuration including the electron-transport layer 114 and the electron-injection layer 115 in addition to the hole-injection layer 111, the hole-transport layer 112, and the light-emitting layer 113 as illustrated in FIG. 3(A); and the configuration including the electron-transport layer 114, the electron-injection layer 115, and a charge-generation layer 116 in addition to the hole-injection layer 111, the hole-transport layer 112, and the light-emitting layer 113 as illustrated in FIG. 3(B). Materials forming the layers are specifically described below.

The hole-injection layer 111 is a layer containing a substance having an acceptor property. Either an organic compound or an inorganic compound can be used as the substance having an acceptor property.

As the substance having an acceptor property, a compound including an electron-withdrawing group (a halogen group or a cyano group) can be used; for example, 7,7,8,8-tetracyano-2,3,5,6-tetrafluoroquinodimethane (abbreviation: F4-TCNQ), 3,6-difluoro-2,5,7,7,8,8-hexacyanoquinodimethane, chloranil, 2,3,6,7,10,11-hexacyano-1,4,5,8,9,12-hexaazatriphenylene (abbreviation: HAT-CN), or 1,3,4,5,7,8-hexafluorotetracyano-naphthoquinodimethane (abbreviation: F6-TCNNQ) can be used. The organic compound having an acceptor property is preferably a compound in which electron-withdrawing groups are bonded to a condensed aromatic ring having a plurality of heteroatoms, like HAT-CN, because it is thermally stable. A [3]radialene derivative including an electron-withdrawing group (in particular, a cyano group or a halogen group such as a fluoro group) has a very high electron-accepting property and thus is preferable; specific examples include α,α',α''-1,2,3-cyclopropanetriylidenetris[4-cyano-2,3,5,6-tetrafluorobenzeneacetonitrile], α,α',α''-1,2,3-cyclopropanetriylidenetris[2,6-dichloro-3,5-difluoro-4-(trifluoromethyl)benzeneacetonitrile], and α,α',α''-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using a phthalocyanine-based complex compound such as phthalocyanine (abbreviation: $H_2Pc$) or copper phthalocyanine (CuPC), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), or a high molecular compound such as poly(3,4-ethylenedioxythiophene)/poly(styrenesulfonic acid) (PEDOT/PSS). The substance having an acceptor property can extract electrons from an adjacent hole-transport layer (or hole-transport material) when an electric field is applied.

Alternatively, a composite material in which a substance having a hole-transport property contains an acceptor substance can be used for the hole-injection layer 111. By using a composite material in which a substance having a hole-transport property contains an acceptor substance, a material used to form an electrode can be selected regardless of its work function. In other words, besides a material having a high work function, a material having a low work function can also be used for the first electrode 101. Examples of the acceptor substance include an organic compound having an acceptor property, such as 7,7,8,8-tetracyano-2,3,5,6-tetrafluoroquinodimethane (abbreviation: F4-TCNQ), chloranil, or 1,3,4,5,7,8-hexafluorotetracyano-naphthoquinodimethane (abbreviation: F6-TCNNQ), and a transition metal oxide. In addition, oxides of metals belonging to Group 4 to Group 8 of the periodic table can be used. As the oxide of a metal belonging to Group 4 to Group 8 in the periodic table, vanadium oxide, niobium oxide, tantalum oxide, chromium oxide, molybdenum oxide, tungsten oxide, manganese oxide, rhenium oxide, or the like is preferably used because their electron-accepting property is high. Among these oxides, molybdenum oxide is particularly preferable because it is stable in the air, has a low hygroscopic property, and is easy to handle.

As the substance having a hole-transport property which is used for the composite material, a variety of organic compounds such as an aromatic amine compound, a carbazole derivative, an aromatic hydrocarbon, and a high molecular compound (an oligomer, a dendrimer, a polymer, or the like) can be used. Note that a substance having a hole mobility of $1 \times 10^{-6}$ cm$^2$/Vs or higher is preferably used as the substance having a hole-transport property which is used for the composite material. Organic compounds that can be used as the substance having a hole-transport property in the composite material are specifically given below.

Examples of the aromatic amine compounds that can be used for the composite material include N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and 1,1-bis-(4-bis(4-methyl-phenyl)-amino-phenyl)-cyclohexane (abbreviation: TAPC). Specific examples of the carbazole derivatives include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carb azolyl)phenyl]benzene (abbreviation: TCPB), 9-[4-(10-phenylanthracene-9-yl)phenyl]-9H-carbazole (abbreviation: CzPA), and 1,4-bis[4-(N-carbazolyl)phenyl]-2,3,5,6-tetraphenylbenzene. Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDB A), 9,10-di(2-naphthyl)anthracen e (abbreviation: DNA), 9,10-diphenyl anthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl) perylene. Besides, pentacene, coronene, and the like can be used. A vinyl skeleton may be included. Examples of the aromatic hydrocarbon having a vinyl group include 4,4'-bis (2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used. In this case, F6-TCNNQ is preferably used as the acceptor substance.

It is also possible to use high molecular compounds such as poly(N-vinylcarbazole) (abbreviation: PVK), poly(4-vinyltriphenylamine) (abbreviation: PVTPA), poly[N-(4-{N'-[4-(4-diphenyl amino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD).

The formation of the hole-injection layer 111 can improve the hole-injection property, whereby a light-emitting element having a low driving voltage can be obtained. The organic compound having an acceptor property is an easy-to-use material because evaporation is easy and its film can be easily formed.

Note that in the case where the hole-injection layer is formed using the above composite material, the layer containing the composite material is extremely appropriate for a layer adjusting the cavity length in the microcavity structure because the composite material has favorable conductivity and is less likely to cause a degradation of driving voltage even if the layer thickness is increased.

The hole-transport layer 112 contains a hole-transport material. The hole-transport material preferably has a hole mobility of $1 \times 10^{-6}$ cm$^2$/Vs or more. The hole-transport layer 112 preferably includes the organic compound of one embodiment of the present invention.

As a material having a hole-transport property, a compound having an aromatic amine skeleton, such as 4,4'-bis [N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)-triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]-fluoren-2-amine (abbreviation: PCBAF), or N-phenyl-N-[4-(9-phenyl-9H-carbazol-3-yl)phenyl]-spiro-9,9'-bifluoren-2-amine (abbreviation: PCBASF), a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP), a compound having a thiophene skeleton, such as 4,4',4"-(benzene-1,3,5-triyl)tri (dibenzothiophene) (abbreviation: DBT3P-II), 2,8-diphenyl-4-[4-(9-phenyl-9H-fluoren-9-yl)phenyl] dibenzothiophene (abbreviation: DBTFLP-III), or 4-[4-(9-phenyl-9H-fluoren-9-yl)phenyl]-6-phenyldibenzothiophene (abbreviation: DBTFLP-IV), and a compound having a furan skeleton, such as 4,4',4"-(benzene-1,3,5-triyl)tri (dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be given. Among the above, the compound having an aromatic amine skeleton and the compound having a carbazole skeleton are preferable because these have favorable reliability, have high hole-transport properties, and contribute to a reduction in driving voltage. Note that any of the substances given as examples of the material having a hole-transport property that is used in the composite material for the hole-injection layer 111 can also be suitably used as the material included in the hole-transport layer 112.

The light-emitting layer 113 is a layer containing the host material and the light-emitting material. The light-emitting material may be fluorescent substances, phosphorescent substances, substances exhibiting thermally activated delayed fluorescence (TADF), or other light-emitting materials. Furthermore, it may be a single layer or be formed of a plurality of layers including different light-emitting materials.

Examples of a material that can be used as a fluorescent substance in the light-emitting layer 113 are as follows. Fluorescent substances other than those given below can also be used.

For example, 5,6-bis[4-(10-phenyl-9-anthryl)phenyl]-2, 2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-diphenyl-N,N'-bis[4-(9-phenyl-9H-fluoren-9-yl)phenyl]pyrene-1,6-diamine (abbreviation: 1,6FL-PAPrn), N,N'-bis(3-methylphenyl)-N,N'-bis[3-(9-phenyl-9H-fluoren-9-yl)phenyl]-pyrene-1,6-diamine (abbreviation: 1,6mMemFLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N",N",N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA) coumarin 545T, N,N'-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[i]quinolizin-9-yl)ethenyl]-4H-pyran-4-ylidene}propanedinitrile (abbreviation: DCM2), N,N,N',N'-tetrakis(4-methylphenyl)

tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), and N,N'-diphenyl-N,N'-(1,6-pyrene-diyl)bis[(6-phenylbenzo[b]naphtho[1,2-d]furan)-8-amine] (abbreviation: 1,6BnfAPrn-03) can be given. In particular, a condensed aromatic diamine compound typified by a pyrenediamine compound such as 1,6FLPAPrn, 1,6mMemFLPAPrn, and 1,6BnfAPrn-03 is preferable because of its high hole-trapping property, high emission efficiency, and high reliability.

Examples of a material that can be used as a phosphorescent substance in the light-emitting layer 113 are as follows.

An organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium (III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), or tris[4-(3-biphenyl)-5-isopropyl-3-phenyl-4H-1,2,4-triazolato]iridium(III) (abbreviation: [Ir(iPrptz-3b)$_3$]), an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) or tris(1-methyl-5-phenyl-3-propyl-1H-1,2,4-triazolato)iridium(III) (abbreviation: [Ir(Prptz1-Me)$_3$]), an organometallic iridium complex having an imidazole skeleton, such as fac-tris[(1-2,6-diisopropylphenyl)-2-phenyl-1H-imidazole]iridium(III) (abbreviation: [Ir(iPrpmi)$_3$]) or tris[3-(2,6-dimethylphenyl)-7-methylimidazo[1,2-f]phenanthridinato]iridium(III) (abbreviation: [Ir(dmpimpt-Me)$_3$]), and an organometallic iridium complex in which a phenylpyridine derivative having an electron-withdrawing group is a ligand, such as bis[2-(4',6'-difluorophenyl)pyridinato-N,C2']iridium(III) tetrakis(1-pyrazolyl)borate (abbreviation: FIr6), bis[2-(4',6'-difluorophenyl)pyridinato-N,C2'] iridium(III) picolinate (abbreviation: FIrpic), bis{2-[3',5'-bis(trifluoromethyl)phenyl]pyridinato-N,C2'}iridium(III) picolinate (abbreviation: [Ir(CF3ppy)$_2$(pic)]), or bis[2-(4',6'-difluorophenyl)pyridinato-N,C2']iridium(III) acetylacetonate (abbreviation: FIracac) can be given. These are compounds exhibiting blue phosphorescence, and are compounds having an emission peak at 440 nm to 520 nm.

Furthermore, an organometallic iridium complex having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), or (acetylacetonato)bis(4,6-diphenylpyrimidinato)iridium(III) (abbreviation: [Ir(dppm)$_2$(acac)]), an organometallic iridium complex having a pyrazine skeleton, such as (acetylacetonato)bis(3,5-dimethyl-2-phenylpyrazinato)iridium(III) (abbreviation: [Ir(mppr-Me)$_2$(acac)]) or (acetylacetonato)bis(5-isopropyl-3-methyl-2-phenylpyrazinato)iridium(III) (abbreviation: [Ir(mppr-iPr)$_2$(acac)]), an organometallic iridium complex having a pyridine skeleton, such as tris(2-phenylpyridinato-N,C2')iridium(III) (abbreviation: [Ir(ppy)$_3$]), bis(2-phenylpyridinato-N,C2')iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,C2')iridium(III) (abbreviation: [Ir(pq)$_3$]), or bis(2-phenylquinolinato-N,C2')iridium(III) acetylacetonate (abbreviation: [Ir(pq)$_2$(acac)]), and a rare earth metal complex such as tris(acetylacetonato)(monophenanthroline)terbium(III) (abbreviation: [Tb(acac)$_3$(Phen)]) can be given. These are mainly compounds exhibiting green phosphorescence, and have an emission peak at 500 nm to 600 nm. Note that an organometallic iridium complex having a pyrimidine skeleton is particularly preferable because of its distinctively high reliability and emission efficiency.

Furthermore, an organometallic iridium complex having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), or bis[4,6-di(naphthalen-1-yl)pyrimidinato] (dipivaloylmethanato)iridium(III) (abbreviation: [Ir(d1npm)$_2$(dpm)]), an organometallic iridium complex having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir(Fdpq)$_2$(acac)]), an organometallic iridium complex having a pyridine skeleton, such as tris(1-phenylisoquinolinato-N,C2')iridium(III) (abbreviation: [Ir(piq)$_3$]) or bis(1-phenylisoquinolinato-N,C2')iridium(III) acetylacetonate (abbreviation: [Ir(piq)$_2$(acac)]), a platinum complex such as 2,3,7,8,12,13,17,18-octaethyl-21H,23H-porphyrin platinum(II) (abbreviation: PtOEP), and a rare earth metal complex such as tris(1,3-diphenyl-1,3-propanedionato) (monophenanthroline)europium(III) (abbreviation: [Eu(DBM)$_3$(Phen)]) or tris[1-(2-thenoyl)-3,3,3-trifluoroacetonato] (monophenanthroline)europium(III) (abbreviation: [Eu(TTA)$_3$(Phen)]) can be given. These are compounds exhibiting red phosphorescence, and have an emission peak at 600 nm to 700 nm. Furthermore, the organometallic iridium complexes including a pyrazine skeleton can emit red light with favorable chromaticity.

Besides the above-described phosphorescent compounds, other known phosphorescent materials may be selected and used.

As the TADF material, a fullerene, a derivative thereof, an acridine, a derivative thereof, an eosin derivative, or the like can be used. Other examples include a metal-containing porphyrin containing magnesium (Mg), zinc (Zn), cadmium (Cd), tin (Sn), platinum (Pt), indium (In), palladium (Pd), or the like. Examples of the metal-containing porphyrin include a protoporphyrin-tin fluoride complex (SnF$_2$(Proto IX)), a mesoporphyrin-tin fluoride complex (SnF$_2$(Meso IX)), a hematoporphyrin-tin fluoride complex (SnF$_2$(Hemato IX)), a coproporphyrin tetramethyl ester-tin fluoride complex (SnF$_2$(Copro III-4Me)), an octaethylporphyrin-tin fluoride complex (SnF₂(OEP)), an etioporphyrin-tin fluoride complex (SnF₂(Etio I)), and an octaethylporphyrin-platinum chloride complex (PtCl₂(OEP)), which are expressed by the following structural formulae.
[Chemical Formula 1]
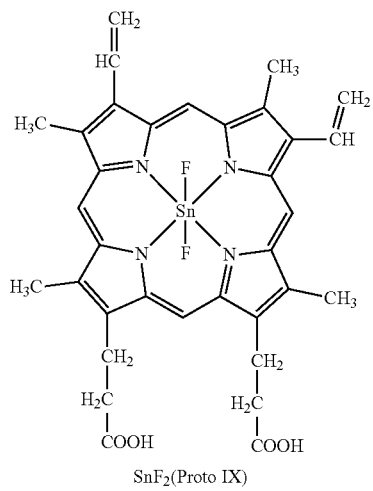
SnF₂(Proto IX)
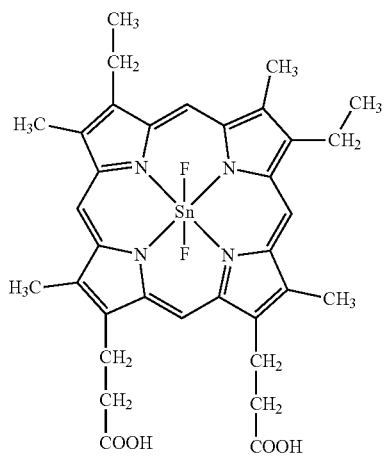
SnF₂(Meso IX)
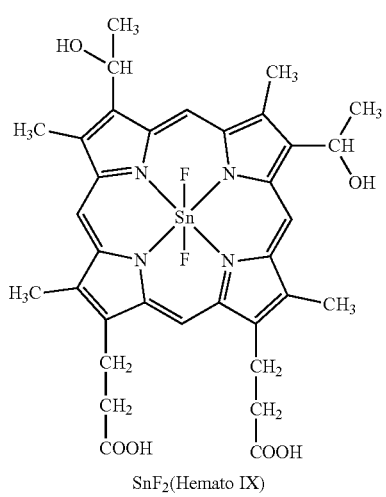
SnF₂(Hemato IX)
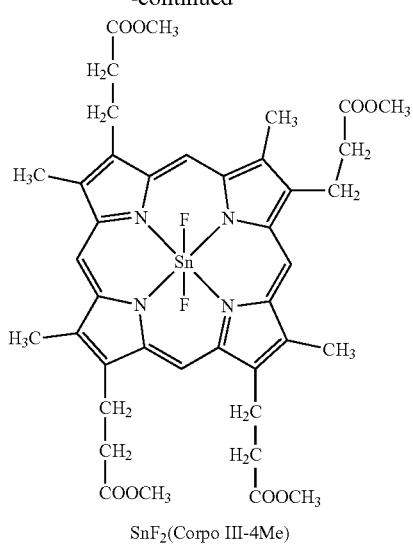
SnF₂(Copro III-4Me)
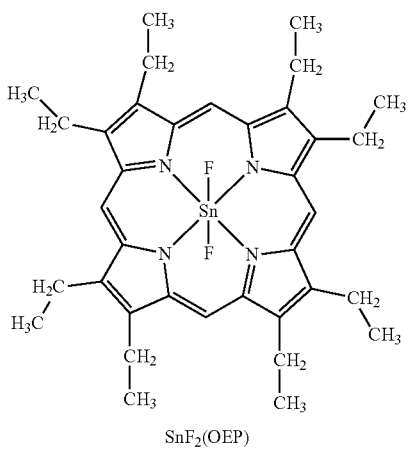
SnF₂(OEP)
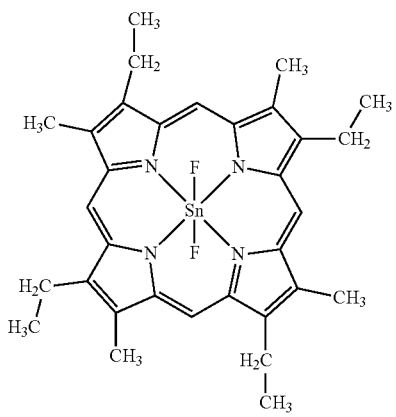
SnF₂(Etio I)

[Chemical Formula 2]

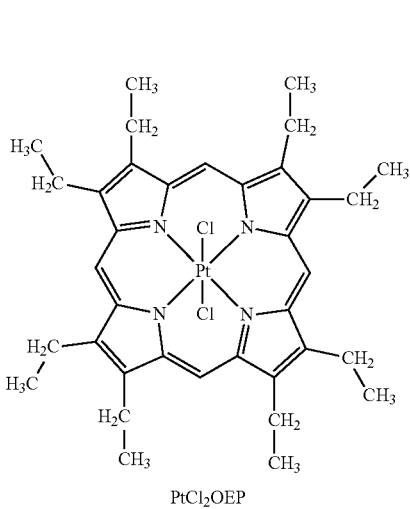

PtCl₂OEP

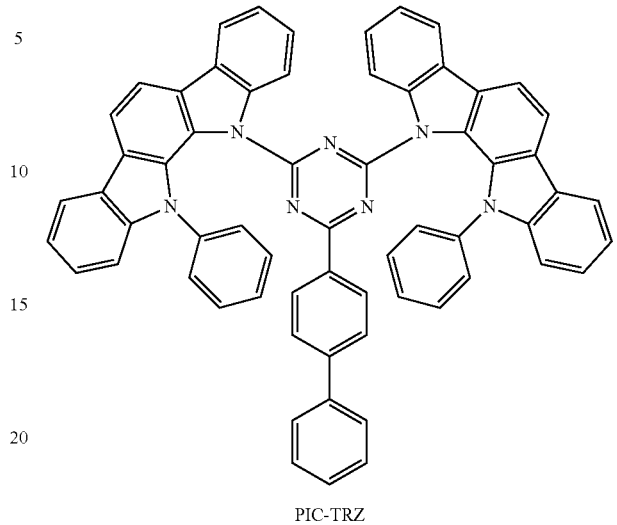

PIC-TRZ

Alternatively, a heterocyclic compound having both of a π-electron rich heteroaromatic ring and a π-electron deficient heteroaromatic ring that is expressed by the following structural formulae, such as 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 9-[4-(4,6-diphenyl-1,3,5-triazin-2-yl)phenyl]-9'-phenyl-9H,9'H-3,3'-bicarbazole (abbreviation: PCCzPTzn), 2-[4-(10H-phenoxazine-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferable because of having both a high electron-transport property and a high hole-transport property owing to a π-electron rich heteroaromatic ring and a π-electron deficient heteroaromatic ring. Note that a substance in which the π-electron rich heteroaromatic ring and the π-electron deficient heteroaromatic ring are directly bonded to each other is particularly preferable because the donor property of the π-electron rich heteroaromatic ring and the acceptor property of the π-electron deficient heteroaromatic ring are both increased and the energy difference between the S1 level and the T1 level becomes small, so that thermally activated delayed fluorescence can be obtained with high efficiency. Note that an aromatic ring to which an electron-withdrawing group such as a cyano group is bonded may be used instead of the π-electron deficient heteroaromatic ring.

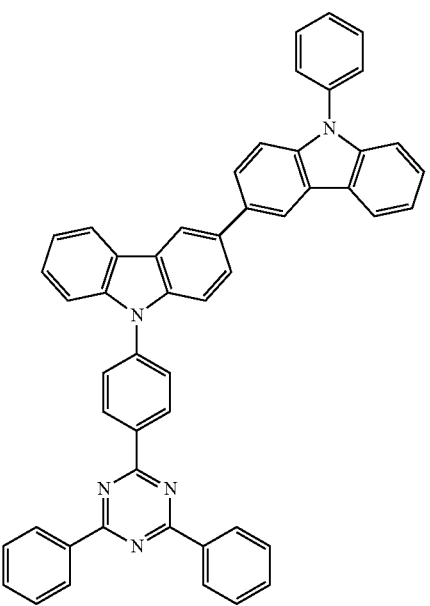

PCCzPTzn

-continued

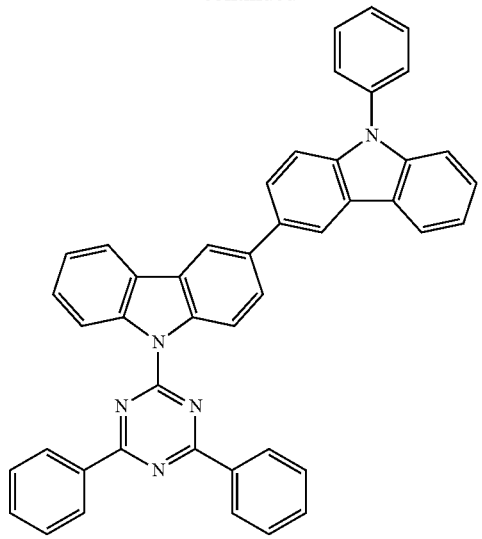

PCCzTzn

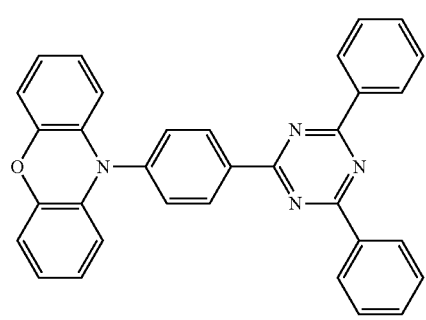

PXZ-TRZ

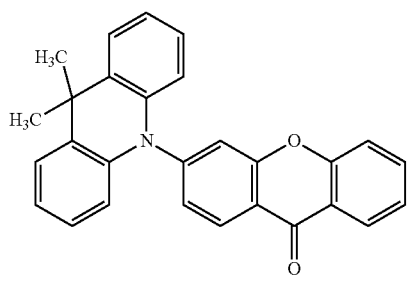

ACRXTN

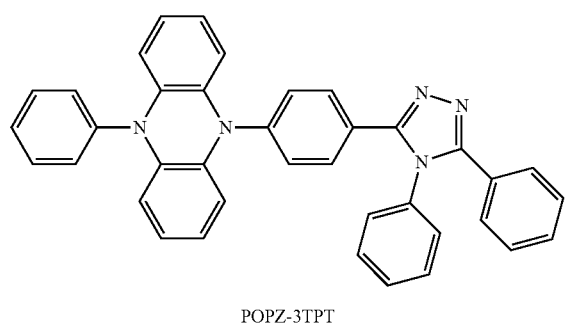

POPZ-3TPT

-continued

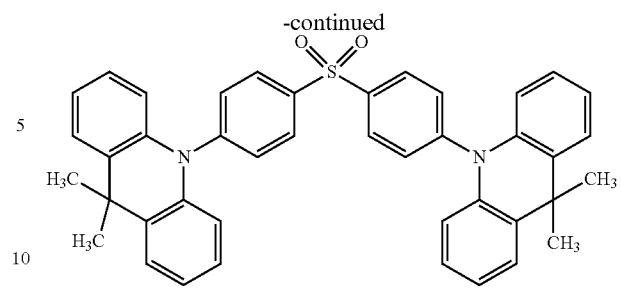

DMAC-DPS

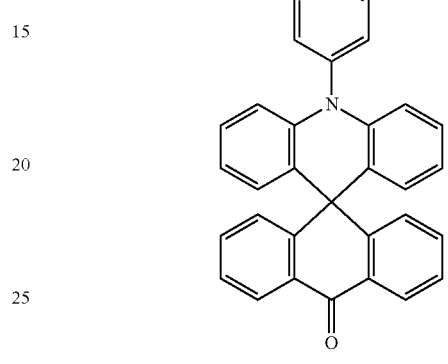

ACRSA

As the host material in the light-emitting layer, a variety of carrier-transport materials such as a material having an electron-transport property and a material having a hole-transport property can be used.

As the material having a hole-transport property, the substance given as the material having a hole-transport property which is contained in the hole-transport layer 112 can be favorably used.

As the material having an electron-transport property, for example, a metal complex such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ), a heterocyclic compound having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II), a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), or 4,6-bis[3-(4-dibenzothienyl)phenyl]pyrimidine (abbreviation: 4,6mDBTP2Pm-II), and a heterocyclic compound having a pyridine skeleton, such as 3,5-bis[3-(9H-carbazol-9-yl)phenyl]pyridine (abbreviation:

35DCzPPy) or 1,3,5-tri[3-(3-pyridyl)-phenyl]benzene (abbreviation: TmPyPB) can be given. Among the above, the heterocyclic compound having a diazine skeleton and the heterocyclic compound having a pyridine skeleton have favorable reliability and thus are preferable. In particular, the heterocyclic compound having a diazine (pyrimidine or pyrazine) skeleton has a high electron-transport property and contributes to a reduction in driving voltage.

In the case where a fluorescent substance is used as the light-emitting material, a material having an anthracene skeleton is suitable for the host material. The use of a substance having an anthracene skeleton as a host material for a fluorescent substance makes it possible to achieve a light-emitting layer with favorable emission efficiency and durability. Most of materials having an anthracene skeleton have a deep HOMO level; therefore, such a material can be preferably used in one embodiment of the present invention. As the substance having an anthracene skeleton that is used as the host material, a substance having a diphenylanthracene skeleton, in particular, a substance having a 9,10-diphenylanthracene skeleton, is preferable because of its chemical stability. The host material preferably has a carbazole skeleton because the hole-injection and hole-transport properties are improved; further preferably, the host material has a benzocarbazole skeleton in which a benzene ring is further condensed to carbazole because the HOMO thereof is shallower than that of carbazole by approximately 0.1 eV and thus holes enter the host material easily. In particular, the host material having a dibenzocarbazole skeleton is preferable because its HOMO is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole skeleton or a dibenzocarbazole skeleton) is further preferable as the host material. Note that in terms of the hole-injection and hole-transport properties described above, instead of a carbazole skeleton, a benzofluorene skeleton or a dibenzo fluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), and 9-phenyl-10-{4-(9-phenyl-9H-fluoren-9-yl)biphenyl-4'-yl}anthracene (abbreviation: FLPPA). In particular, CzPA, cgDBCzPA, 2mBnfPPA, and PCzPA are preferably selected because they exhibit favorable characteristics.

Note that a host material may be a material of a mixture of a plurality of kinds of substances; in the case of using a mixed host material, it is preferable to mix a material having an electron-transport property with a material having a hole-transport property. When the material having an electron-transport property is mixed with the material having a hole-transport property, the transport property of the light-emitting layer 113 can be easily adjusted and a recombination region can be easily controlled. The ratio of the content of the material having a hole-transport property to the content of the material having an electron-transport property may be the material having a hole-transport property: the material having an electron-transport property=1:9 to 9:1.

An exciplex may be formed by these mixed materials. A combination is preferably selected so as to form an exciplex that exhibits light emission overlapping with the wavelength of a lowest-energy-side absorption band of a light-emitting material, because energy can be transferred smoothly and light emission can be efficiently obtained. The use of the configuration is preferable because the driving voltage is also be reduced.

Note that as in one embodiment of the present invention, a top-emission element exhibits light emission from the cathode side. Although deposition of the light-emitting layer over the hole-transport layer is performed from the anode side, in the case where different substances are stacked, the alignment of molecules may be disordered due to interaction between the substances. The alignment disorder of molecules becomes smaller as the same substance is stacked more; therefore, in the light-emitting layer, the alignment is probably more ordered on a side closer to the cathode.

Disorder of the alignment of molecules causes disorder of the direction of extracted light, resulting in a reduction in the amount of extracted light. In the case of a bottom emission element, the light-emitting layer in a portion with the most disordered alignment exists in a position close to an electrode closest to the light extraction side; however, as in one embodiment of the present invention, in the case of a top emission element, the light-emitting layer in a portion with the most ordered alignment exists in a position close to the electrode on the light extraction side, and thus the alignment direction of light extracted from the light-emitting layer is ordered and the light extraction efficiency is improved, leading to an increase in external quantum efficiency.

The electron-transport layer 114 is a layer containing a substance having an electron-transport property. As the substance having an electron-transport property, it is possible to use any of the above-listed substances having electron-transport properties that can be used as the host material.

As the electron-injection layer 115, a layer containing an alkali metal, an alkaline earth metal, or a compound thereof, such as lithium fluoride (LiF), cesium fluoride (CsF), or calcium fluoride ($CaF_2$), may be provided between the electron-transport layer 114 and the second electrode 102. For example, an electride or a layer that is formed using a substance having an electron-transport property and that includes an alkali metal, an alkaline earth metal, or a compound thereof can be used as the electron-injection layer 115. Examples of the electride include a substance in which electrons are added at high concentration to a mixed oxide of calcium and aluminum.

Note that as the electron-injection layer 115, it is possible to use a layer that contains a substance having an electron-transport property (preferably an organic compound having a bipyridine skeleton) and contains a fluoride of the alkali metal or the alkaline earth metal at a concentration higher than that at which the electron-injection layer 115 becomes in a microcrystalline state (50 wt % or higher). Since the layer has a low refractive index, a light-emitting element including the layer can have high external quantum efficiency.

Instead of the electron-injection layer 115, a charge-generation layer 116 may be provided (FIG. 3(B)). The charge-generation layer 116 refers to a layer capable of injecting holes into a layer in contact therewith on the cathode side and injecting electrons into a layer in contact therewith on the anode side when supplied with a potential. The charge-generation layer 116 includes at least a P-type layer 117. The P-type layer 117 is preferably formed using the composite materials given above as the material that can form the hole-injection layer 111. The P-type layer 117 may be formed by stacking a film containing the above acceptor material as a material included in the composite material and a film containing the above hole-transport material. When a potential is applied to the P-type layer 117, electrons are injected into the electron-transport layer 114 and holes are injected into the second electrode 102 that is a cathode; thus, the light-emitting element operates. Since the organic compound of one embodiment of the present invention has a low refractive index, using the organic compound for the P-type layer 117 enables the light-emitting element to have high external quantum efficiency.

Note that one or both of an electron-relay layer 118 and an electron-injection buffer layer 119 are preferably provided in the charge-generation layer 116 in addition to the P-type layer 117.

The electron-relay layer 118 contains at least a substance having an electron-transport property and has a function of preventing an interaction between the electron-injection buffer layer 119 and the P-type layer 117 to transfer electrons smoothly. The LUMO level of the substance having an electron-transport property contained in the electron-relay layer 118 is preferably between the LUMO level of an acceptor substance in the P-type layer 117 and the LUMO level of a substance contained in a layer of the electron-transport layer 114 in contact with the charge-generation layer 116. A specific energy level of the LUMO level of the substance having an electron-transport property used for the electron-relay layer 118 may be higher than or equal to −5.0 eV, preferably higher than or equal to −5.0 eV and lower than or equal to −3.0 eV. Note that as the substance having an electron-transport property used for the electron-relay layer 118, a phthalocyanine-based material or a metal complex having a metal-oxygen bond and an aromatic ligand is preferably used.

For the electron-injection buffer layer 119, a substance having a high electron-injection property, such as an alkali metal, an alkaline earth metal, a rare earth metal, or a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)), can be used.

In the case where the electron-injection buffer layer 119 is formed so as to contain the substance having an electron-transport property and a donor substance, an organic compound such as tetrathianaphthacene (abbreviation: TTN), nickelocene, or decamethylnickelocene can be used as the donor substance, as well as an alkali metal, an alkaline earth metal, a rare earth metal, a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)). Note that as the substance having an electron-transport property, a material similar to the above-described material forming the electron-transport layer 114 can be used for the formation.

As a substance forming the second electrode 102, a metal, an alloy, an electrically conductive compound, or a mixture thereof having a low work function (specifically, 3.8 eV or less) or the like can be used. As specific examples of such a cathode material, elements belonging to Group 1 or Group 2 of the periodic table, such as alkali metals, e.g., lithium (Li) and cesium (Cs), magnesium (Mg), calcium (Ca), and strontium (Sr), alloys containing these (MgAg and AlLi), rare earth metals such as europium (Eu) and ytterbium (Yb), alloys containing these rare earth metals, and the like can be given. However, when the electron-injection layer is provided between the second electrode 102 and the electron-transport layer, as the second electrode 102, a variety of conductive materials such as Al, Ag, ITO, or indium oxide-tin oxide containing silicon or silicon oxide can be used regardless of their work functions. Films of these conductive materials can be formed by a dry process such as a vacuum evaporation method or a sputtering method, an inkjet method, a spin coating method, or the like. Alternatively, the films may be formed by a wet process using a sol-gel method or a wet process using a paste of a metal material.

Various methods can be used as a method for forming the EL layer 103 regardless of whether it is a dry process or a wet process. For example, a vacuum evaporation method, a gravure printing method, an offset printing method, a screen printing method, an ink-jet method, a spin coating method, or the like may be used.

Different deposition methods may be used to form the electrodes or the layers described above.

The configuration of the layers provided between the first electrode 101 and the second electrode 102 is not limited to the above-described configuration. However, a configuration is preferable in which a light-emitting region where holes and electrons recombine is provided at a position away from the first electrode 101 and the second electrode 102 so as to prevent quenching caused by the proximity of the light-emitting region and a metal used for electrodes and carrier-injection layers.

Furthermore, in order to inhibit energy transfer from an exciton generated in the light-emitting layer, it is preferable to form the hole-transport layer and the electron-transport layer that are in contact with the light-emitting layer 113, particularly a carrier-transport layer closer to the recombination region in the light-emitting layer 113, using the light-emitting material of the light-emitting layer or a substance having a wider band gap than the light-emitting material included in the light-emitting layer.

Next, an embodiment of a light-emitting element with a configuration where a plurality of light-emitting units is stacked (also referred to as a stacked-type device or a tandem device) will be described with reference to FIG. 3(C) and FIG. 3(D). This light-emitting element is a light-emitting element including a plurality of light-emitting units between an anode and a cathode. One light-emitting unit has substantially the same configuration as that of the EL layer 103, which is illustrated in FIG. 3(A). In other words, the light-emitting element illustrated in each of FIG. 3(C) and FIG. 3(D) can be called a light-emitting element including a plurality of light-emitting units, and the light-emitting element illustrated in each of FIG. 3(A) and FIG. 3(B) can be called a light-emitting element including one light-emitting unit.

Figure 3C:
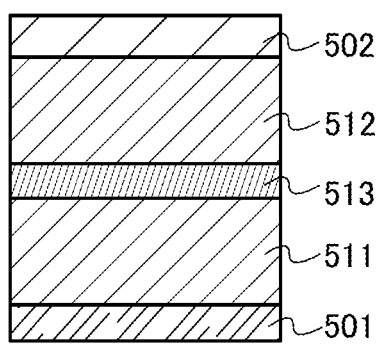

In FIG. 3(C), a first light-emitting unit 511 and a second light-emitting unit 512 are stacked between an anode 501 and a cathode 502, and a charge-generation layer 513 is provided between the first light-emitting unit 511 and the second light-emitting unit 512. In FIG. 3(D), the first light-emitting unit 511, the second light-emitting unit 512, and a third light-emitting unit 515 are stacked between the cathode 501 and the cathode 502, the charge-generation layer 513 is provided between the first light-emitting unit 511 and the second light-emitting unit 512, and a charge-generation layer 514 is provided between the second light-emitting unit 512 and the third light-emitting unit 515. The anode 501 and the cathode 502 correspond, respectively, to the first electrode 101 and the second electrode 102 illustrated in FIG. 3(A), and the materials given in the description for FIG. 3(A) can be used. Furthermore, the first light-emitting unit 511, the second light-emitting unit 512, and the third light-emitting unit 515 may have the same configuration or different configurations. In the case where the same configuration is employed, double luminance can be obtained with the same current density, so that the lifetime of the light-emitting element can be significantly improved.

Each of the charge-generation layer 513 and the charge-generation layer 514 has a function of injecting electrons into one of the light-emitting units and injecting holes into the other of the light-emitting units when a voltage is applied between the anode 501 and the cathode 502. That is, in FIG. 3(C), the charge-generation layer 513 injects electrons into the first light-emitting unit 511 and holes into the second light-emitting unit 512 when a voltage is applied so that the potential of the anode becomes higher than the potential of the cathode. That is, in FIG. 3(D), the charge-generation layer 514 injects electrons into the second light-emitting unit 512 and holes into the third light-emitting unit 515 when a voltage is applied so that the potential of the anode becomes higher than the potential of the cathode.

The charge-generation layer 513 and the charge-generation layer 514 preferably have a configuration similar to that of the charge-generation layer 116 described with reference to FIG. 3(B).

In the case where the anode-side surface of a light-emitting unit is in contact with the charge-generation layer 513, the charge-generation layer 513 can also function as a hole-injection layer of the light-emitting unit; therefore, a hole-injection layer is not necessarily provided in the light-emitting unit. In the case where the charge-generation layer 513 includes the electron-injection buffer layer 119, the electron-injection buffer layer 119 functions as the electron-injection layer in the light-emitting unit on the anode side and thus, an electron-injection layer is not necessarily formed in the light-emitting unit on the anode side. As the charge-generation layer 513 is described above, the charge-generation layer 514 can also have a similar configuration.

The light-emitting element having two light-emitting units is described with reference to FIG. 3(C), and the light-emitting element having three light-emitting units is described with reference to FIG. 3(D); however, one embodiment of the present invention can also be applied to a light-emitting element in which four or more light-emitting units are stacked. With a plurality of light-emitting units partitioned by the charge-generation layer 513 or the charge-generation layer 514 between a pair of electrodes as in the light-emitting element of this embodiment, it is possible to provide a long-life element that can emit light at high luminance with the current density kept low. Moreover, a light-emitting device that can be driven at a low voltage and has low power consumption can be achieved.

The above-described layers and electrodes such as the EL layer 103, the first light-emitting unit 511, the second light-emitting unit 512, the third light-emitting unit, and the charge-generation layer can be formed by a method such as an evaporation method (including a vacuum evaporation method), a droplet discharge method (also referred to as an ink-jet method), a coating method, or a gravure printing method. A low molecular material, a middle molecular material (including an oligomer and a dendrimer), or a high molecular material may be included in the layers and electrodes.

Embodiment 4

In this embodiment, a light-emitting device of one embodiment of the present invention will be described.

Figure 4A:
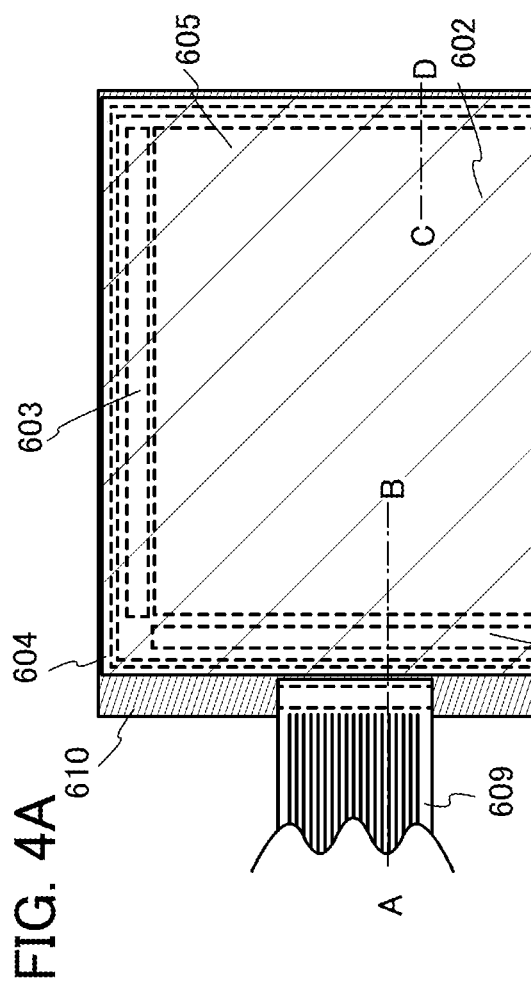
FIG. 4(A) and FIG. 4(B) are schematic diagrams of an active matrix light-emitting device.
Figure 4B:
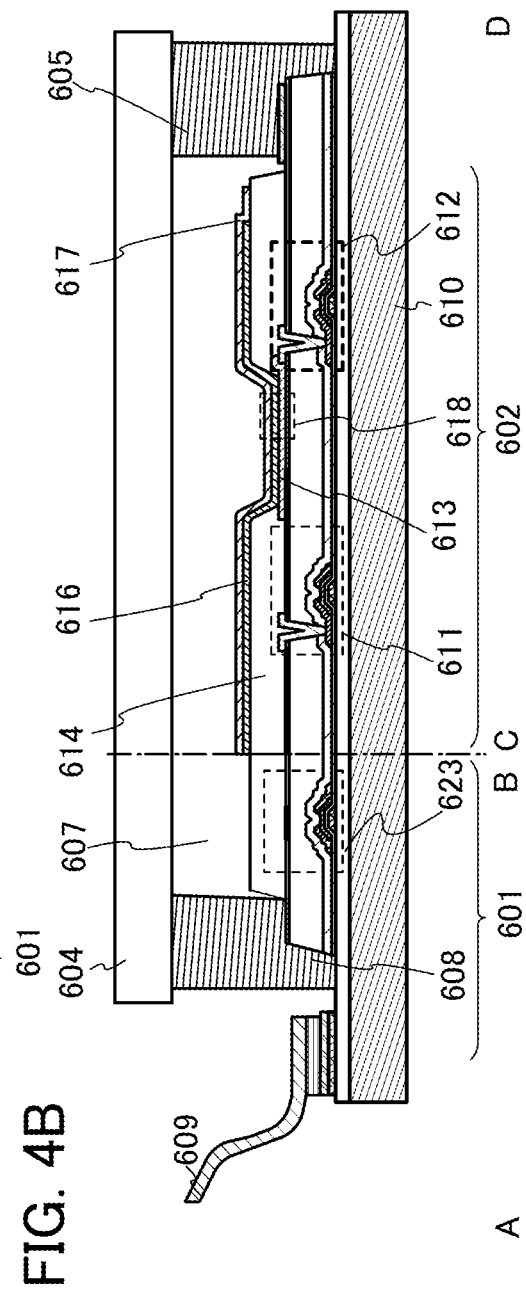

In this embodiment, a light-emitting device fabricated using the light-emitting elements described in Embodiment 1 to Embodiment 3 will be described with reference to FIG. 4. Note that FIG. 4(A) is a top view illustrating the light-emitting device, and FIG. 4(B) is a cross-sectional view taken along A-B and C-D in FIG. 4(A). This light-emitting device includes 601, a pixel portion 602, and a driver circuit portion (a gate line driver circuit) 603. Furthermore, 604 denotes a sealing substrate, 605 denotes a sealant, and the inside surrounded by the sealant 605 is a space 607.

Note that a lead wiring 608 is a wiring for transmitting signals to be input to the source line driver circuit 601 and the gate line driver circuit 603 and receiving a video signal, a clock signal, a start signal, a reset signal, and the like from an FPC (flexible printed circuit) 609 serving as an external input terminal. Although only the FPC is illustrated here, a printed wiring board (PWB) may be attached to this FPC. The light-emitting device in this specification includes not only the light-emitting device itself but also the device provided with the FPC or the PWB.

Next, a cross-sectional structure will be described with reference to FIG. 4(B). The driver circuit portion and the pixel portion are formed over an element substrate 610. Here, the source line driver circuit 601, which is the driver circuit portion, and one pixel of the pixel portion 602 are illustrated.

The element substrate 610 may be fabricated using a substrate containing glass, quartz, an organic resin, a metal, an alloy, a semiconductor, or the like, or a plastic substrate formed of FRP (Fiber Reinforced Plastic), PVF (polyvinyl fluoride), polyester, acrylic resin, or the like.

The structure of transistors used in pixels and driver circuits is not particularly limited. For example, an inverted staggered transistor or a staggered transistor may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as In—Ga—Zn-based metal oxide, may be used.

There is no particular limitation on the crystallinity of a semiconductor material used for the transistors, and any of an amorphous semiconductor or a semiconductor having crystallinity (a microcrystalline semiconductor, a polycrystalline semiconductor, a single-crystal semiconductor, and a semiconductor partly including crystal regions) may be used. A semiconductor having crystallinity is preferably used, in which case deterioration of the transistor characteristics can be suppressed.

Here, an oxide semiconductor is preferably used for semiconductor devices such as the transistors provided in the pixels and driver circuits and transistors used for touch sensors described later, and the like. In particular, an oxide semiconductor having a wider band gap than silicon is preferably used. The use of an oxide semiconductor material having a wider band gap than silicon can reduce the off-state current of the transistors.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such a material as the semiconductor layer makes it possible to achieve a highly reliable transistor in which a change in the electrical characteristics is reduced.

Charge accumulated in a capacitor through a transistor including the above-described semiconductor layer can be retained for a long time because of the low off-state current of the transistor. The use of such a transistor in pixels allows a driver circuit to stop while the gray level of an image displayed on each display region is maintained. As a result, electronic equipment with significantly reduced power consumption can be achieved.

For stable characteristics of the transistor or the like, a base film is preferably provided. The base film can be formed to be a single-layer or a stacked-layer using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the driver circuit portion 601. The driver circuit can be formed using various circuits such as a CMOS circuit, a PMOS circuit, and an NMOS circuit. Although a driver-integrated type in which the driver circuit is formed over the substrate is described in this embodiment, the driver circuit is not necessarily formed over the substrate and can be formed outside.

The pixel portion 602 is formed with a plurality of pixels including a switching FET 611, a current control FET 612, and a first electrode 613 electrically connected to a drain of the current control FET 612; however, without being limited thereto, a pixel portion in which three or more FETs and a capacitor are combined may be employed.

Note that an insulator 614 is formed to cover an end portion of the first electrode 613. The insulator 614 can be formed using a positive photosensitive acrylic resin film here.

In order to improve the coverage with an EL layer or the like to be formed later, the insulator 614 is formed so as to have a curved surface with curvature at its upper end portion or lower end portion. For example, in the case where positive photosensitive acrylic resin is used as a material for the insulator 614, only the upper end portion of the insulator 614 preferably has a curved surface with a curvature radius (0.2 µm to 3 µm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 to 20 wt %, a titanium nitride film, a chromium film, a tungsten film, a Zn film, a Pt film, or the like, a stacked layer of titanium nitride film and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. The EL layer 616 has the configuration described in Embodiment 3. Alternatively, a material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof (e.g., MgAg, MgIn, or AlLi)) is preferably used. Note that in the case where light generated in the EL layer 616 passes through the second electrode 617, it is preferable to use, for the second electrode 617, a stacked layer of a thin metal film and a transparent conductive film (e.g., ITO, indium oxide containing zinc oxide at 2 to 20 wt %, indium tin oxide containing silicon, or zinc oxide (ZnO)).

Note that a light-emitting element is formed with the first electrode 613, the EL layer 616, and the second electrode 617. The light-emitting element is the light-emitting element described in Embodiment 3. A plurality of light-emitting elements are formed in the pixel portion, and the light-emitting device of this embodiment may include both the light-emitting element described in Embodiment 3 and a light-emitting element having a different configuration.

The sealing substrate 604 and the element substrate 610 are attached to each other using the sealant 605, so that a structure is employed in which a light-emitting element 618 is provided in the space 607 surrounded by the element substrate 610, the sealing substrate 604, and the sealant 605. The space 607 is filled with a filler; it is filled with an inert gas (e.g., nitrogen or argon) in some cases, and filled with the sealant in some cases. The configuration of the sealing substrate in which a recessed portion is formed and a desiccant is provided is preferable because deterioration due to the influence of moisture can be inhibited.

Note that an epoxy-based resin or glass frit is preferably used for the sealant 605. Furthermore, these materials are preferably materials that transmit moisture or oxygen as little as possible. As the material used for the sealing substrate 604, in addition to a glass substrate and a quartz substrate, a plastic substrate formed of FRP (Fiber Reinforced Plastics), PVF (polyvinyl fluoride), polyester, acrylic resin, or the like can be used.

Although not illustrated in FIG. 4, a protective film may be provided over the second electrode. The protective film may be formed using an organic resin film or an inorganic insulating film. The protective film may be formed so as to cover an exposed portion of the sealant 605. The protective film may be provided so as to cover surfaces and side surfaces of the pair of substrates and exposed side surfaces of a sealing layer, an insulating layer, and the like.

For the protective film, a material that is less likely transmit an impurity such as water. Thus, diffusion of an impurity such as water from the outside into the inside can be effectively inhibited.

As a material included in the protective film, an oxide, a nitride, a fluoride, a sulfide, a ternary compound, a metal, a polymer, or the like can be used; for example, it is possible to use a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide; a material containing aluminum nitride, hafnium nitride, silicon nitride, tantalum nitride, titanium nitride, niobium nitride, molybdenum nitride, zirconium nitride, gallium nitride; a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like.

The protective film is preferably formed using a deposition method that enables favorable step coverage. One such method is an atomic layer deposition (ALD) method. A material that can be formed by an ALD method is preferably used for the protective film. With the use of an ALD method, a dense protective film with reduced defects such as cracks and pinholes or with a uniform thickness can be formed. Furthermore, damage caused to a process member in forming the protective film can be reduced.

By an ALD method, a uniform protective film with few defects can be formed even on a surface with a complex uneven shape or upper, side, and lower surfaces of a touch panel.

FIG. 5 illustrates an example of a light-emitting device in which a light-emitting element exhibiting blue light emission is formed and color conversion layers are provided to achieve full-color display. FIG. 5(A) illustrates a substrate 1001, abase insulating film 1002, agate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of light-emitting elements, a partition wall 1025, an EL layer 1028, a second electrode 1029 of the light-emitting elements, a sealing substrate 1031, a sealing material 1032, and the like.

In FIG. 5(A), color conversion layers and a structure having a function of scattering light (a red color conversion layer 1034R, a green color conversion layer 1034G, and a structure 1134B having a function of scattering light) are provided on a transparent base material 1033. A black matrix 1035 may be additionally provided. The transparent base material 1033 provided with the color conversion layers, the structure having a function of scattering light, and the black matrix is aligned and fixed to the substrate 1001. Note that the color conversion layers, the structure having a function of scattering light, and the black matrix 1035 may be covered with an overcoat layer 1036.

FIG. 5(B) illustrates an example in which the color conversion layers and the structure having a function of scattering light (the red color conversion layer 1034R, the green color conversion layer 1034G, and the structure 1134B having a function of scattering light) are formed between the gate insulating film 1003 and the first interlayer insulating film 1020. The coloring layers may be provided between the substrate 1001 and the sealing substrate 1031 in this manner.

Figure 6:
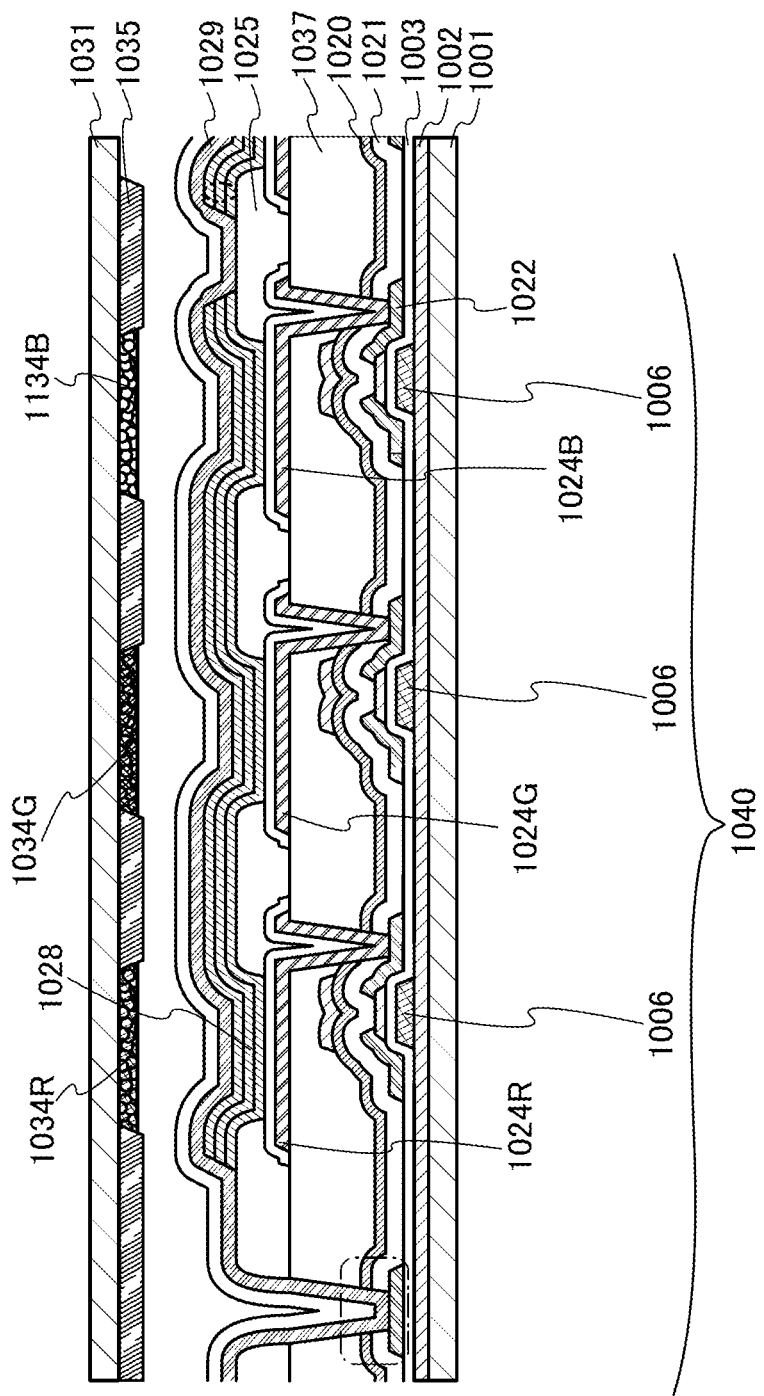
FIG. 6 is a schematic diagram of an active matrix light-emitting device.

The above-described light-emitting device is a light-emitting device having a structure in which light is extracted to the substrate 1001 side where the FETs are formed (a bottom-mission type), but may be a light-emitting device having a structure in which light emission is extracted to the sealing substrate 1031 side (a top-emission type). FIG. 6 is a cross-sectional view of a top-emission light-emitting device. In this case, a substrate that does not transmit light can be used as the substrate 1001. The top-emission light-emitting device is formed in a manner similar to that of the bottom-emission light-emitting device until a connection electrode which connects the FET and the anode of the light-emitting element is formed. Then, a third interlayer insulating film 1037 is formed to cover an electrode 1022. This insulating film may have a planarization function. The third interlayer insulating film 1037 can be formed using a material similar to that for the second interlayer insulating film or using any other known materials.

The first electrodes 1024R, 1024G, and 1024B of the light-emitting elements each function as an anode here, but may function as a cathode. Furthermore, in the case of the top-emission light-emitting device illustrated in FIG. 6, the first electrodes are preferably reflective electrodes. The EL layer 1028 has an element configuration with which blue light emission can be obtained.

In the case of a top emission structure as illustrated in FIG. 6, sealing can be performed with the sealing substrate 1031 provided with the color conversion layers and the structure having a function of scattering light (the red color conversion layer 1034R, the green color conversion layer 1034G, and the structure 1134B having a function of scattering light). The sealing substrate 1031 may be provided with the black matrix 1035 which is positioned between pixels. The color conversion layers and the structure having a function of scattering light (the red color conversion layer 1034R, the green color conversion layer 1034G, and the structure 1134B having a function of scattering light) and the black matrix may be covered with the overcoat layer 1036. Note that a light-transmitting substrate is used as the sealing substrate 1031. The color conversion layers and the structure having a function of scattering light (the red color conversion layer 1034R, the green color conversion layer 1034G, and the structure 1134B having a function of scattering light) may be provided directly on the second electrode 1029 (or on a protection film provided over the second electrode 1029).

Note that in the above configuration, the EL layer may have a configuration including a plurality of light-emitting layers or may have a configuration including a single light-emitting layer. In combination with the tandem light-emitting element described above, for example, it can be used in a configuration where a light-emitting element is provided with a plurality of EL layers, a charge-generation layer is provided between the EL layers, and each EL layer includes a plurality of light-emitting layers or a single light-emitting layer.

In FIG. 15(A), the color conversion layers (the red color conversion layer 1034R and the green color conversion layer 1034G) are provided on the transparent base material 1033. The black matrix 1035 may be additionally provided. The transparent base material 1033 provided with the color conversion layers, the structure having a function of scattering light, and the black matrix is aligned and fixed to the substrate 1001. Note that the color conversion layers, the structure having a function of scattering light, and the black matrix 1035 may be covered with the overcoat layer 1036.

FIG. 15(B) illustrates an example in which the color conversion layers (the red color conversion layer 1034R and the green conversion layer 1034G) are formed between the gate insulating film 1003 and the first interlayer insulating film 1020. The coloring layers may be provided between the substrate 1001 and the sealing substrate 1031 in this manner.

In FIGS. 15(A) and 15(B), as a means for imparting directivity to light, semi-transmissive and semi-reflective layers 1043 are provided so that the color conversion layers (the red color conversion layer 1034R and the green color conversion layer 1034G) are interposed. The pair of semi-transmissive and semi-reflective layers 1043 provided so that the color conversion layers are interposed are formed such that the optical distance from an interface of one of the semi-transmissive and semi-reflective films to an interface of the other of the semi-transmissive and semi-reflective layers is the integral multiple of λ/2 when the peak wavelength of light emitted from the color conversion layer is λ(nm).

Figure 16:
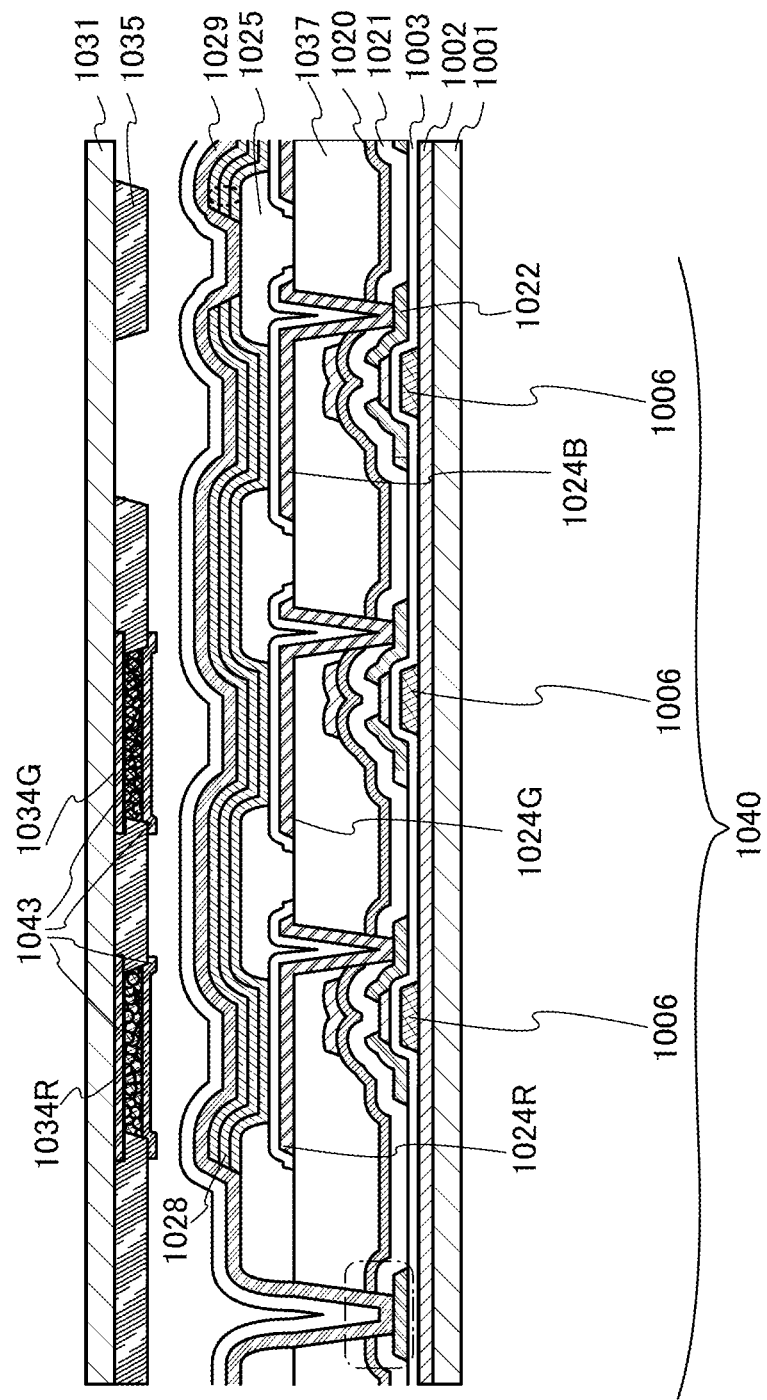
FIG. 16 is a conceptual diagram of an active matrix light-emitting device.

The above-described light-emitting device is a light-emitting device having a structure in which light is extracted to the substrate 1001 side where the FETs are formed (a bottom-emission type), but may be a light-emitting device having a structure in which light emission is extracted to the sealing substrate 1031 side (a top-emission type). FIG. 16 is a cross-sectional view of a top-emission light-emitting device. In this case, a substrate that does not transmit light can be used as the substrate 1001. The top-emission light-emitting device is formed in a manner similar to that of the bottom-emission light-emitting device until a connection electrode which connects the FET and the anode of the light-emitting element is formed. Then, the third interlayer insulating film 1037 is formed to cover the electrode 1022. This insulating film may have a planarization function. The third interlayer insulating film 1037 can be formed using a material similar to that for the second interlayer insulating film or using any other known materials.

The first electrodes 1024R, 1024G, and 1024B of the light-emitting elements each function as an anode here, but may function as a cathode. Furthermore, in the case of the top-emission light-emitting device illustrated in FIG. 16, the first electrodes are preferably reflective electrodes. The EL layer 1028 has an element configuration with which blue light emission can be obtained.

In the case of a top emission structure as illustrated in FIG. 16, sealing can be performed with the sealing substrate 1031 provided with the color conversion layers (the red color conversion layer 1034R and the green conversion layer 1034G). The sealing substrate 1031 may be provided with the black matrix 1035 which is positioned between pixels. The color conversion layers (the red color conversion layer 1034R and the green color conversion layer 1034G) and the black matrix may be covered with the overcoat layer 1036. Note that a light-transmitting substrate is used as the sealing substrate 1031. The color conversion layers (the red color conversion layer 1034R and the green conversion layer 1034G) may be provided directly on the second electrode 1029 (or on a protection film provided over the second electrode 1029).

Note that in the above configuration, the EL layer may have a configuration including a plurality of light-emitting layers or may have a configuration including a single light-emitting layer. In combination with the tandem light-emitting element described above, for example, it can be used in a configuration where a light-emitting element is provided with a plurality of EL layers, a charge-generation layer is provided between the EL layers, and each EL layer includes a plurality of light-emitting layers or a single light-emitting layer.

A light-emitting device in this embodiment has a small difference in alignment characteristics between pixels and between light emission colors and thus can have high display quality.

A light-emitting device in this embodiment has a small difference in alignment characteristics between pixels and between light emission colors and thus can have high display quality.

This embodiment can be freely combined with any of the other embodiments.

Embodiment 5

A pixel circuit including a memory for correcting gray levels displayed by pixels that can be used in one embodiment of the present invention and a display device including the pixel circuit will be described below.

Figure 3D:
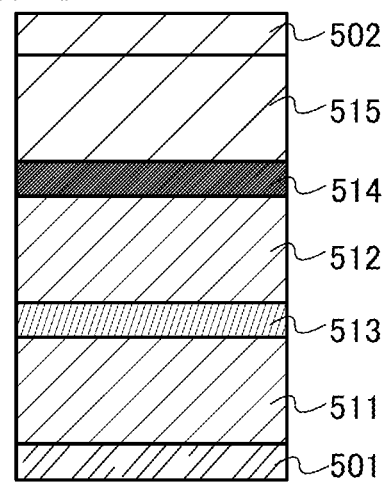

A circuit configuration described in this embodiment can be favorably used for a light-emitting element including a plurality of light-emitting units between a pair of electrodes as illustrated in FIG. 3(C) and FIG. 3(D).

[Circuit Configuration]

Figure 12A:
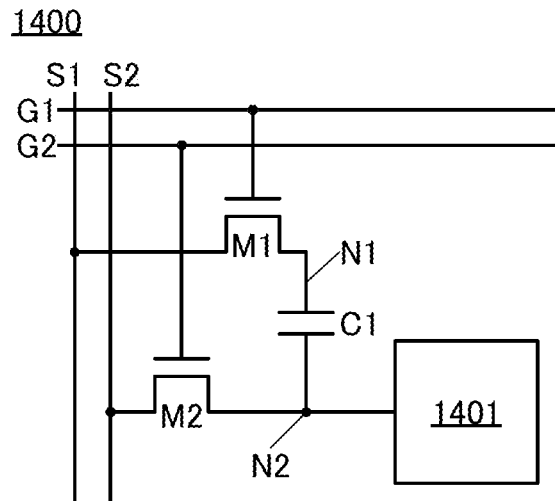
FIG. 12(A) to FIG. 12(C) are diagrams illustrating circuit configurations.

FIG. 12(A) is a circuit diagram of a pixel circuit 1400. The pixel circuit 1400 includes a transistor M1, a transistor M2, a capacitor C1, and a circuit 1401. A wiring S1, a wiring S2, a wiring G1, and a wiring G2 are connected to the pixel circuit 1400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 1401.

The circuit 1401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is denoted as N1, and a node connecting the transistor M2 and the circuit 1401 is denoted as N2.

In the pixel circuit 1400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

A variety of known transistors can be used as the transistor M1 and the transistor M2; for example, a transistor using an oxide semiconductor can be used as one or both of the transistor M1 and the transistor M2. In the case where a transistor using an oxide semiconductor is used, owing to an extremely low off-state current which is a feature of the transistor, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method Example]

Figure 12B:
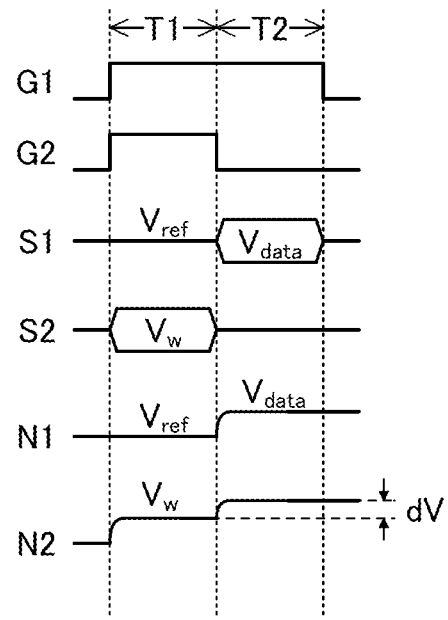

Next, an example of a method for operating the pixel circuit 1400 is described with reference to FIG. 12(B). FIG. 12(B) is a timing chart of the operation of the pixel circuit 1400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 12(B), one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$-$V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential Vw and the potential dV is input to the circuit 1401. Note that although dV is shown as a positive value in FIG. 12(B), dV may be a negative value. That is, the potential $V_{data}$ may be lower than the potential $V_{ref}$.

Here, the potential dV is roughly determined by the capacitance of the capacitor C1 and the capacitance of the circuit 1401. When the capacitance of the capacitor C1 is sufficiently larger than the capacitance of the circuit 1401, the potential dV is a potential close to the second data potential $V_{data}$.

In the above manner, the pixel circuit 1400 can generate a potential to be supplied to the circuit 1401 including the display element, by combining two kinds of data signals; hence, a gray level can be corrected in the pixel circuit 1400.

The pixel circuit 1400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

[Application Example]

Figure 12C:
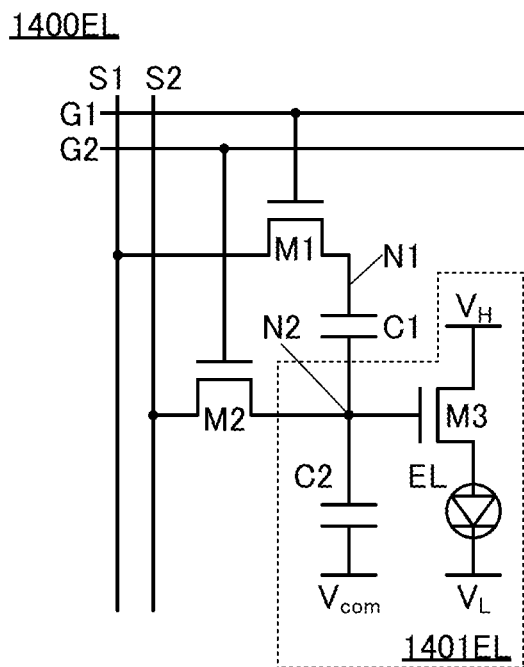

A pixel circuit 1400EL illustrated in FIG. 12(C) includes a circuit 1401EL. The circuit 1401EL includes a light-emitting element EL, a transistor M3, and a capacitor C2.

In the transistor M3, a gate is connected to the node N2 and one electrode of the capacitor C2, one of a source and a drain is connected to a wiring supplied with a potential $V_H$, and the other of the source and the drain is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling a current to be supplied to the light-emitting element EL. The capacitor C2 functions as a storage capacitor. The capacitor C2 can be omitted when not needed.

Note that although the configuration in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 1400EL, a large amount of current can flow through the light-emitting element EL when a high potential is applied to the gate of the transistor M3, which enables HDR display, for example. Moreover, a variation in the electrical characteristics of the transistor M3 and the light-emitting element EL can be corrected by supply of a correction signal to the wiring S1 or the wiring S2.

Note that the configuration is not limited to the circuits shown in FIG. 12(C), and a configuration to which a transistor, a capacitor, or the like is further added may be employed.

At least part of this embodiment can be implemented in combination with the other embodiments described in this specification as appropriate.

Embodiment 6

In this embodiment, examples of electronic devices each partly including the light-emitting device of one embodiment of the present invention will be described. The light-emitting device of one embodiment of the present invention has high display quality, and thus an electronic device having high image quality can be obtained.

Examples of electronic devices to which the light-emitting element is applied include a television devices (also referred to as TV or television receivers), monitors for computers and the like, cameras such as digital cameras and digital video cameras, digital photo frames, mobile phones (also referred to as portable telephones or portable telephone devices), portable game machines, portable information terminals, audio playback devices, and large game machines such as pin-ball machines. Specific examples of these electronic devices are shown below.

FIG. 7(A) illustrates an example of a television device. In the television device, a display portion 7103 is incorporated in a housing 7101. Here, a configuration in which the housing 7101 is supported by a stand 7105 is illustrated. Images can be displayed on the display portion 7103.

The television device can be operated with an operation switch of the housing 7101 or a separate remote controller 7110. With operation keys 7109 of the remote controller 7110, channels and volume can be operated and images displayed on the display portion 7103 can be operated. Furthermore, a configuration may be employed in which the remote controller 7110 is provided with a display portion 7107 for displaying data output from the remote controller 7110.

Note that the television device has a configuration of including a receiver, a modem, and the like. With use of the receiver, a general television broadcast can be received, and moreover, when the television device is connected to a communication network with or without a wire via the modem, one-way (from a sender to a receiver) or two-way (between a sender and a receiver or between receivers) data communication can be performed.

FIG. 7(B1) is a computer which includes a main body 7201, a housing 7202, a display portion 7203, a keyboard 7204, an external connection port 7205, a pointing device 7206, and the like. The computer in FIG. 7(B1) may be such a mode as illustrated in FIG. 7(B2). The computer in FIG. 7(B2) is provided with a second display portion 7210 instead of the keyboard 7204 and the pointing device 7206. The second display portion 7210 is of a touch-panel type, and input can be performed by operating display for input displayed on the second display portion 7210 with a finger or a dedicated pen. The second display portion 7210 can also display images other than the display for input. The display portion 7203 may also be a touch panel. Connecting the two screens with a hinge can prevent troubles such as a crack in or damage to the screens caused when the computer is stored or carried.

FIG. 7(C) illustrates an example of a portable terminal. A mobile phone includes operation buttons 7403, an external connection port 7404, a speaker 7405, a microphone 7406, and the like in addition to a display portion 7402 incorporated in a housing 7401.

The portable terminal illustrated in FIG. 7(C) may have a configuration in which information can be input by touching the display portion 7402 with a finger or the like. In this case, operations such as making a call and creating an e-mail can be performed by touching the display portion 7402 with a finger or the like.

The display portion 7402 has mainly three screen modes. The first one is a display mode mainly for displaying images, and the second one is an input mode mainly for inputting data such as text. The third one is a display+input mode in which two modes of the display mode and the input mode are combined.

For example, in the case of making a call or creating an e-mail, a text input mode mainly for inputting text is selected for the display portion 7402 so that an operation of inputting text displayed on the screen may be performed. In this case, it is preferable to display a keyboard or number buttons on almost the entire screen of the display portion 7402.

When a sensing device including a sensor for sensing inclination, such as a gyroscope sensor or an acceleration sensor, is provided inside the portable terminal, screen display of the display portion 7402 can be automatically changed by determining the orientation of the portable terminal (vertically or horizontally).

The screen modes are changed by touching the display portion 7402 or operating the operation buttons 7403 of the housing 7401. Alternatively, the screen modes can be changed depending on the kind of image displayed on the display portion 7402. For example, when a signal of an image displayed on the display portion is moving image data, the screen mode is changed to the display mode, and when the signal is text data, the screen mode is changed to the input mode.

Moreover, in the input mode, when input by the touch operation of the display portion 7402 is not performed for a certain period while a signal sensed by an optical sensor in the display portion 7402 is sensed, the screen mode may be controlled so as to be changed from the input mode to the display mode.

The display portion 7402 can also function as an image sensor. For example, an image of a palm print, a fingerprint, or the like is taken when the display portion 7402 is touched with the palm or the finger, whereby personal authentication can be performed. Furthermore, by using a backlight which emits near-infrared light or a sensing light source which emits near-infrared light in the display portion, an image of a finger vein, a palm vein, or the like can be taken.

Note that the configurations described in this embodiment can be combined with the configuration described in any of Embodiment 1 to Embodiment 5 as appropriate.

As described above, the application range of the light-emitting device of one embodiment of the present invention is significantly wide so that this light-emitting device can be applied to electronic devices in a variety of fields. By using the light-emitting device of one embodiment of the present invention, an electronic device having high display quality can be obtained.

Figure 8A:
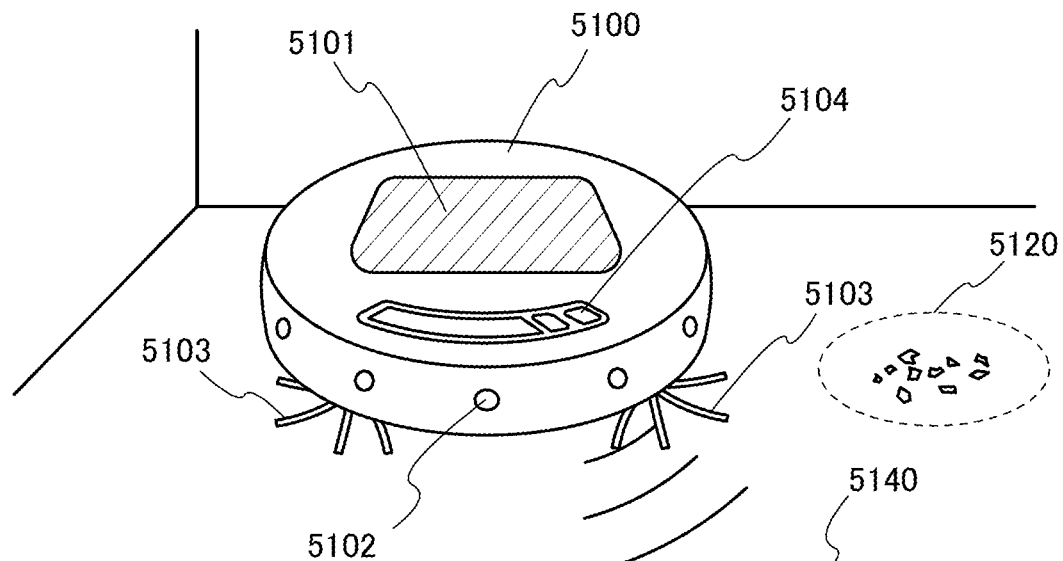
FIG. 8(A) to FIG. 8(C) are diagrams illustrating electronic devices.

FIG. 8(A) is a schematic view illustrating an example of a cleaning robot.

A cleaning robot 5100 includes a display 5101 placed on its top surface, a plurality of cameras 5102 placed on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and sucks up the dust through the inlet provided on the bottom surface.

The cleaning robot 5100 can judge whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. The portable electronic device 5140 can display images taken by the cameras 5102. Accordingly, an owner of the cleaning robot 5100 can monitor the room even from the outside. The display on the display 5101 can be checked by the portable electronic equipment such as a smartphone.

The light-emitting device of one embodiment of the present invention can be used for the display 5101.

Figure 8B:
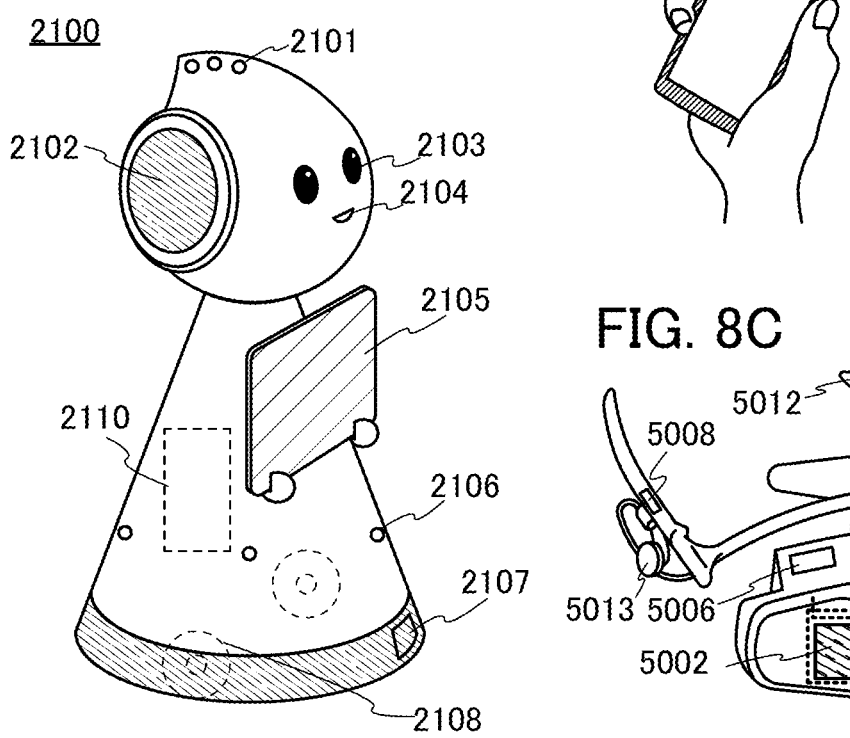

A robot 2100 illustrated in FIG. 8(B) includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting device of one embodiment of the present invention can be used for the display 2105.

Figure 8C:
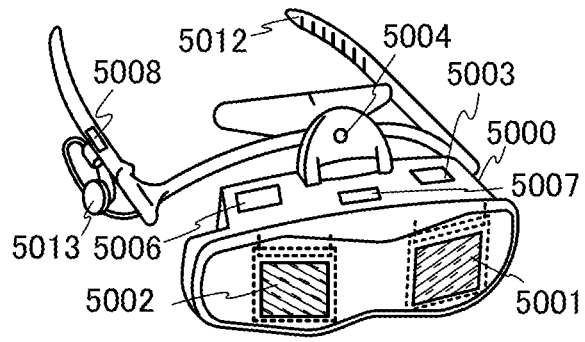

FIG. 8(C) illustrates an example of a goggle-type display. The goggle-type display includes, for example, a housing 5000, a display portion 5001, a speaker 5003, an LED lamp 5004, an operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared ray), a microphone 5008, a display portion 5002, a support 5012, an earphone 5013, and the like.

The light-emitting device of one embodiment of the present invention can be used for the display portion 5001 and the second display portion 5002.

Figure 9:
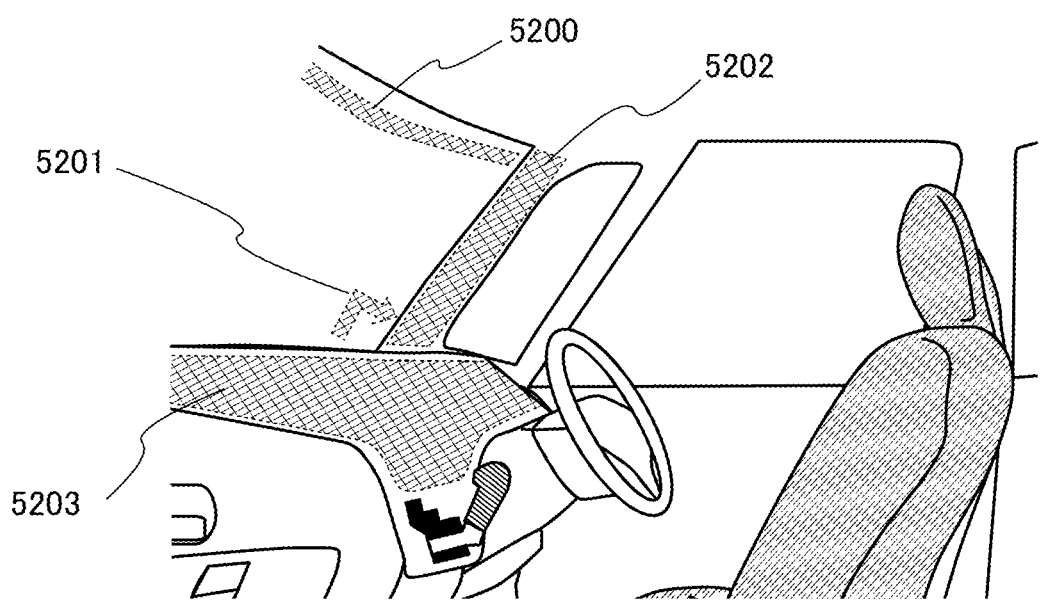
FIG. 9 is a diagram illustrating in-vehicle display devices and lighting devices.

The light-emitting device of one embodiment of the present invention can also be used for a windshield or a dashboard of an automobile. FIG. 9 illustrates one mode in which the light-emitting device of one embodiment of the present invention is used for an automobile windshield and an automobile dashboard. A display region 5200 to a display region 5203 are each a display region provided using the light-emitting device of one embodiment of the present invention.

The display region 5200 and the display region 5201 are display devices provided in the automobile windshield, in which the light-emitting devices of one embodiment of the present invention are incorporated. When first electrodes and second electrodes of the light-emitting devices of one embodiment of the present invention are formed of electrodes having light-transmitting properties, what is called see-through display devices, through which the opposite side can be seen, can be obtained. See-through display devices can be provided without hindering the vision even when being provided in the automobile windshield. Note that in the case where a driving transistor or the like is provided, a transistor having a light-transmitting property, such as an organic transistor using an organic semiconductor material or a transistor using an oxide semiconductor, is preferably used.

A display region 5202 is a display device provided in a pillar portion into which the light-emitting device of one embodiment of the present invention is incorporated. The display region 5202 can compensate for the view hindered by the pillar by displaying an image taken by an imaging means provided on the car body. Similarly, the display region 5203 provided in the dashboard portion can compensate for the view hindered by the car body by displaying an image taken by an imaging means provided on the outside of the automobile. Thus, blind areas can be compensated for and the safety can be enhanced. Showing an image so as to compensate for the area that cannot be seen makes it possible to confirm safety more naturally and comfortably.

The display region 5203 can provide a variety of kinds of information by displaying navigation data, a speedometer, a tachometer, a mileage, a fuel meter, a gearshift state, air-condition setting, and the like. The content or layout of the display can be changed as appropriate in accordance with the preference of a user. Note that such information can also be provided on the display region 5200 to the display region 5202. The display region 5200 to the display region 5203 can also be used as lighting devices.

Figure 10A:
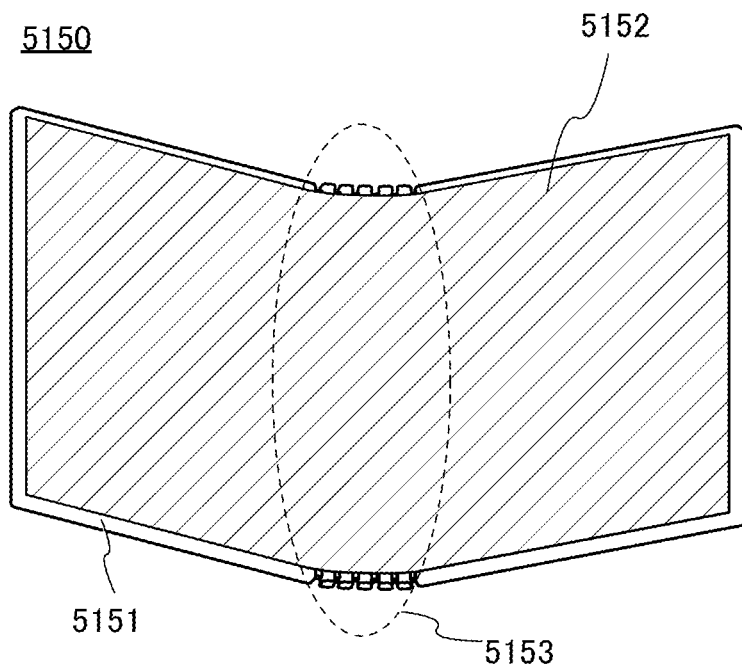
FIG. 10(A) and FIG. 10(B) are diagrams illustrating an electronic device.
Figure 10B:
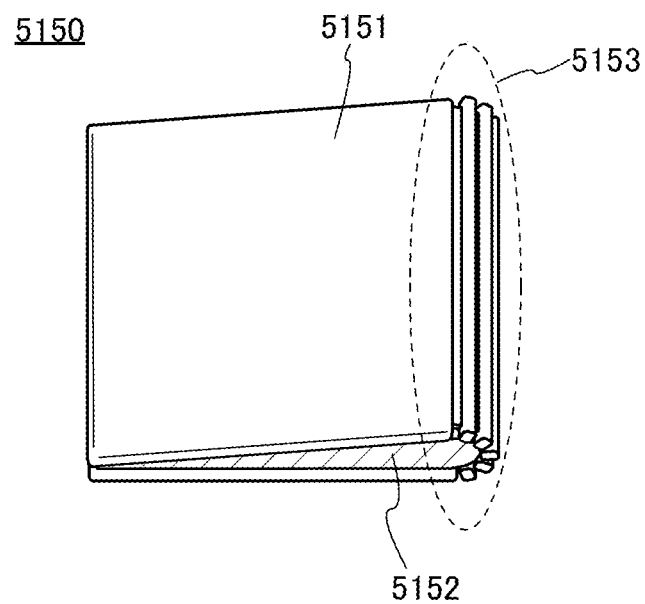

FIGS. 10(A) and 10(B) illustrate a foldable portable information terminal 5150. The foldable portable information terminal 5150 includes a housing 5151, a display region 5152, and a bend portion 5153. FIG. 10(A) illustrates the portable information terminal 5150 that is opened. FIG. 10(B) illustrates the portable information terminal that is folded. The portable information terminal 5150 is compact in size and has excellent portability when folded, despite its large display region 5152.

The display region 5152 can be folded in half with the bend portion 5153. The bend portion 5153 is made up of a flexible member and a plurality of supporting members, and when the display region 5152 is folded, the flexible member is stretched. The bend portion 5153 has a radius of curvature of greater than or equal to 2 mm, preferably greater than or equal to 3 mm when folded.

Note that the display region 5152 may be a touch panel (an input/output device) controlling a touch sensor (an input device). The light-emitting device of one embodiment of the present invention can be used for the display region 5152.

Figure 11A:
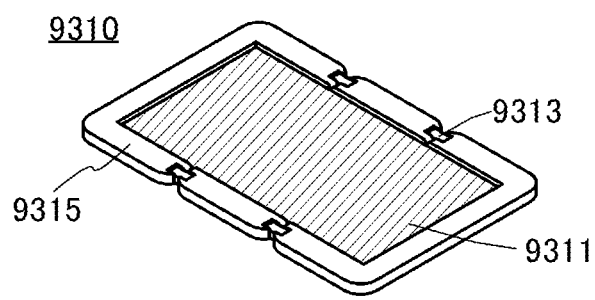
FIG. 11(A) to FIG. 11(C) are diagrams illustrating an electronic device.
Figure 11B:
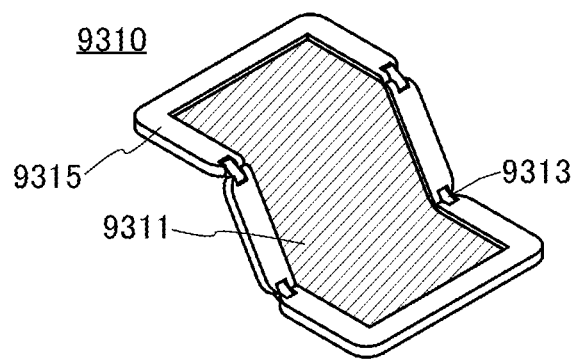
Figure 11C:
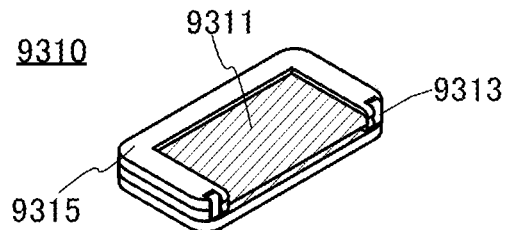

FIGS. 11(A) to 11(C) illustrate a foldable portable information terminal 9310. FIG. 11(A) illustrates the portable information terminal 9310 that is opened. FIG. 11(B) illustrates the portable information terminal 9310 which is in the state of being changed from one of an opened state and a folded state to the other. FIG. 11(C) illustrates the portable information terminal 9310 that is folded. The portable information terminal 9310 is excellent in portability when folded, and is excellent in display browsability when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. A light-emitting device of one embodiment of the present invention can be used for the display panel 9311. A display region 9312 in the display panel 9311 is a display region that is positioned at a side surface of the portable information terminal 9310 which is folded.

REFERENCE NUMERALS

101: first electrode, 102: second electrode, 103: EL layer, 111: hole-injection layer, 112: hole-transport layer, 113: light-transmitting layer, 114: electron-transport layer, 115: electron-injection layer, 116: charge-generation layer, 117: P-type layer, 118: electron-relay layer, 119: electron-injection buffer layer, 200: insulator, 201B: first electrode, 201G: first electrode, 201R: first electrode, 202: EL layer, 203: second electrode, 204: protection layer, 205B: structure, 205G: first color conversion layer, 205R: second color conversion layer, 206: black matrix, 207B: first light-emitting element, 207G: second light-emitting element, 207R: third light-emitting element, 208B: first pixel, 208G: second pixel, 208R: third pixel, 209: optical distance, 210G: means for imparting directivity, 210R: means for imparting directivity, 215B: layer, 225B: blue color filter, 501: anode, 502: cathode, 511: first light-emitting unit, 512: second light-emitting unit, 513: charge-generation layer, 514: charge-generation layer, 515: third light-emitting unit, 601: driver circuit portion (source line driver circuit), 602: pixel portion, 603: driver circuit portion (gate line driver circuit), 604: sealing substrate, 605: sealant, 607: space, 608: wiring, 609: FPC (flexible printed circuit), 610: element substrate, 611: switching FET, 612: current control FET, 613: first electrode, 614: insulator, 616: EL layer, 617: second electrode, 618: light-emitting element, 1001: substrate, 1002: base insulating film, 1003: base insulating film, 1006: gate electrode, 1007: gate electrode, 1008: gate electrode, 1020: first interlayer insulating film, 1021: second interlayer insulating film, 1022: electrode, 1024R: first electrode, 1024G: first electrode, 1024B: first electrode, 1025: partition wall, 1028: EL layer, 1029: second electrode, 1031: sealing substrate, 1032: sealing material, 1033: transparent base material, 1034R: red color conversion layer, 1034G: green color conversion layer, 1134B: structure having a function of scattering light, 1035: black matrix, 1036: overcoat layer, 1037: third interlayer insulating film, 1040: pixel portion, 1041: driver circuit portion, 1042: peripheral portion, 1043: semi-transmissive and semi-reflective layer, 1400: pixel portion, 1401: circuit, 2001: housing, 2002: light source, 2100: robot, 2110: arithmetic device, 2101: illuminance sensor, 2102: microphone, 2103: upper camera, 2104: speaker, 2105: display, 2106: lower camera, 2107: obstacle sensor, 2108: moving mechanism, 3001: lighting device, 5000: housing, 5001: display portion, 5102: camera, 5103: brush, 5104: operation button, 5150: portable information terminal, 5151: housing, 5152: display region, 5153: bend portion, 5120: dust, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: second display portion, 7401: housing, 7402: display portion, 7403: operation button, 7404: external connection port, 7405: speaker, 7406: microphone, 7400: mobile phone, 9310: portable information terminal, 9311: display panel, 9312: display region, 9313: hinge, 9315: housing This application is based on Japanese Patent Application Serial No. 2018-108414 filed with Japan Patent Office on Jun. 6, 2018, Japanese Patent Application Serial No. 2018-108428 filed with Japan Patent Office on Jun. 6, 2018, and Japanese Patent Application Serial No. 2019-007585 filed with Japan Patent Office on Jan. 21, 2019, the entire contents of which are hereby incorporated herein by reference.

The invention claimed is:

1. A light-emitting device comprising:
   a first pixel comprising a first light-emitting element and a light-scattering layer; and
   a second pixel comprising a second light-emitting element and a first color conversion layer,
   wherein an emission center substance in each of the first light-emitting element and the second light-emitting element is an organic compound,
   wherein the light-scattering layer comprises a first substance that scatters light emitted from the first light-emitting element,
   wherein the first color conversion layer comprises a second substance that emits light by absorbing light emitted from the second light-emitting element,
   wherein the first light-emitting element and the second light-emitting element have a microcavity structure,
   wherein light emitted from the first pixel has a first color,
   wherein light emitted from the second pixel has a second color,
   wherein a third color is different from the first color and the second color,
   wherein light with the first color is extracted from the first pixel via the light-scattering layer, and
   wherein light with the third color is extracted from the second pixel without going through the light-scattering layer.

2. The light-emitting device according to claim 1, wherein a peak wavelength of light emitted from the emission center substance is 420 nm to 480 nm.

3. The light-emitting device according to claim 1 wherein the emission center substance is a common substance in the first light-emitting element and the second light-emitting element.

4. The light-emitting device according to claim 1 wherein the first light-emitting element and the second light-emitting element have the same structure.

5. The light-emitting device according to claim 1 wherein the first substance is a microparticle of titanium oxide.

6. The light-emitting device according to claim 1, wherein the second substance is a quantum dot.

7. The light-emitting device according to claim 1,
   wherein the first color is blue, and
   wherein the third color is green or red.

8. The light-emitting device according to claim 1, further comprising:
   a third pixel,
   wherein the third pixel comprises a third light-emitting element and a second color conversion layer,
   wherein the second color conversion layer comprises a third substance that emits light by absorbing light emitted from the third light-emitting element, and
   wherein the third light-emitting element has a microcavity structure.

9. The light-emitting device according to claim 8, wherein the third substance is a quantum dot.

10. The light-emitting device according to claim 8, wherein the emission center substance is a common substance in the first light-emitting element, the second light-emitting element, and the third light-emitting element.

11. The light-emitting device according to claim 8, wherein each of the first pixel, the second pixel and the third pixel exhibits light with a different wavelength from each other.

12. The light-emitting device according to claim 1, wherein the light-scattering layer also serves as a blue color filter.

13. The light-emitting device according to claim 1, wherein the first pixel further comprises a color filter.

14. An electronic device comprising:
    the light-emitting device according to claim 1; and
    one of a sensor, an operation button, a speaker and a microphone.

15. A display device comprising the light-emitting device according to claim 1.

16. A light-emitting device comprising:
    a first pixel comprising a first light-emitting element; and
    a second pixel comprising a second light-emitting element and a first color conversion layer,
    wherein an emission center substance in each of the first light-emitting element and the second light-emitting element is an organic compound,
    wherein the first color conversion layer comprises a substance that emits light by absorbing light emitted from the second light-emitting element,
    wherein each of the first light-emitting element and the second light-emitting element has a semi-transmissive and semi-reflective electrode, wherein the first color conversion layer is interposed between the semi-transmissive and semi-reflective electrode and a semi-transmissive and semi-reflective layer, wherein light emitted from the first light-emitting element has a first color, wherein the first color conversion layer comprises a quantum-dot material, wherein light with the first color is extracted from the first pixel, wherein light with a second color is extracted from the second pixel, and wherein the second color is different from the first color.

17. The light-emitting device according to claim 16, wherein the semi-transmissive and semi-reflective layer has a reflectivity higher than or equal to 20% and lower than or equal to 80% with respect to light emitted from the first color conversion layer.

18. The light-emitting device according to claim 16, further comprising a third pixel, wherein the third pixel comprises a third light-emitting element and a second color conversion layer, wherein $\lambda$ is a peak wavelength of light emitted from the first color conversion layer, and wherein the optical distance of a portion interposed between the semi-transmissive and semi-reflective electrode and the semi-transmissive and semi-reflective layer is the integral multiple of $\lambda/4$.

* * * * *